(12) United States Patent
Bergmann et al.

(10) Patent No.: US 9,443,903 B2
(45) Date of Patent: *Sep. 13, 2016

(54) LOW TEMPERATURE HIGH STRENGTH METAL STACK FOR DIE ATTACHMENT

(75) Inventors: Michael John Bergmann, Chapel Hill, NC (US); Christopher D. Williams, Morrisville, NC (US); Kevin Shawne Schneider, Cary, NC (US); Kevin Haberern, Cary, NC (US); Matthew Donofrio, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/361,569

(22) Filed: Jan. 30, 2012

(65) Prior Publication Data

US 2012/0211793 A1 Aug. 23, 2012

Related U.S. Application Data

(63) Continuation-in-part of application No. 13/011,417, filed on Jan. 21, 2011, now Pat. No. 8,698,184, and a continuation-in-part of application No. 11/844,127, filed on Aug. 23, 2007, now Pat. No. 7,910,945, which is a continuation-in-part of application No. 11/428,158, filed on Jun. 30, 2006, now Pat. No. 8,643,195.

(51) Int. Cl.
*H01L 33/62* (2010.01)
*H01L 27/15* (2006.01)
(Continued)

(52) U.S. Cl.
CPC ............ *H01L 27/153* (2013.01); *H01L 24/29* (2013.01); *H01L 24/83* (2013.01); *H01L 25/0753* (2013.01); *H01L 33/40* (2013.01); *H01L 24/32* (2013.01); *H01L 33/62* (2013.01); *H01L 2224/16225* (2013.01); *H01L 2224/29* (2013.01); *H01L 2224/2908* (2013.01); *H01L 2224/2919* (2013.01); *H01L 2224/29083* (2013.01); *H01L 2224/29084* (2013.01); *H01L 2224/29101* (2013.01); *H01L 2224/29111* (2013.01); *H01L 2224/29144* (2013.01); *H01L 2224/29155* (2013.01); *H01L 2224/32014* (2013.01); *H01L 2224/32225* (2013.01);
(Continued)

(58) Field of Classification Search
None
See application file for complete search history.

(56) References Cited

U.S. PATENT DOCUMENTS

D264,792 S 6/1982 Conti
D283,399 S 4/1986 Forbes, Jr.
(Continued)

OTHER PUBLICATIONS

Minor et al. Growth of a Au—Ni—Sn Intermetallic Compound on the Solder-Substrate Interface after Aging. Mar. 2000. Metallurgical and Materials Transactions A. vol. 31A. pp. 798-800.*

(Continued)

*Primary Examiner* — Hoang-Quan Ho
(74) *Attorney, Agent, or Firm* — Myers Bigel & Sibley, P.A.

(57) ABSTRACT

A light emitting diode structure includes a diode region and a metal stack on the diode region. The metal stack includes a barrier layer on the diode region and a bonding layer on the barrier layer. The barrier layer is between the bonding layer and the diode region. The bonding layer includes gold, tin and nickel. A weight percentage of tin in the bonding layer is greater than 20 percent and a weight percentage of gold in the bonding layer is less than about 75 percent. A weight percentage of nickel in the bonding layer may be greater than 10 percent.

34 Claims, 13 Drawing Sheets

(51) Int. Cl.
  *H01L 23/00* (2006.01)
  *H01L 25/075* (2006.01)
  *H01L 33/40* (2010.01)
(52) U.S. Cl.
  CPC ........... *H01L 2224/32245* (2013.01); *H01L 2224/32258* (2013.01); *H01L 2224/3303* (2013.01); *H01L 2224/4814* (2013.01); *H01L 2224/48091* (2013.01); *H01L 2224/48137* (2013.01); *H01L 2224/48227* (2013.01); *H01L 2224/48247* (2013.01); *H01L 2224/49107* (2013.01); *H01L 2224/73265* (2013.01); *H01L 2224/83* (2013.01); *H01L 2924/00013* (2013.01); *H01L 2924/014* (2013.01); *H01L 2924/01005* (2013.01); *H01L 2924/0105* (2013.01); *H01L 2924/01006* (2013.01); *H01L 2924/01013* (2013.01); *H01L 2924/01023* (2013.01); *H01L 2924/01029* (2013.01); *H01L 2924/0132* (2013.01); *H01L 2924/0133* (2013.01); *H01L 2924/01033* (2013.01); *H01L 2924/01047* (2013.01); *H01L 2924/01049* (2013.01); *H01L 2924/01058* (2013.01); *H01L 2924/01075* (2013.01); *H01L 2924/01078* (2013.01); *H01L 2924/01079* (2013.01); *H01L 2924/01082* (2013.01); *H01L 2924/01087* (2013.01); *H01L 2924/01322* (2013.01); *H01L 2924/0665* (2013.01); *H01L 2924/10158* (2013.01); *H01L 2924/12041* (2013.01)

(56) References Cited

U.S. PATENT DOCUMENTS

| | | |
|---|---|---|
| D305,410 S | 1/1990 | Tyler |
| D327,234 S | 6/1992 | Vaughn |
| 5,309,001 A | 5/1994 | Watanabe et al. |
| 5,794,839 A * | 8/1998 | Kimura et al. ........... 228/123.1 |
| D421,046 S | 2/2000 | Popat |
| D448,404 S | 9/2001 | Hamilton et al. |
| 6,518,598 B1 | 2/2003 | Chen |
| 6,547,249 B2 | 4/2003 | Collins et al. |
| D476,680 S | 7/2003 | Haas |
| 6,656,422 B2 | 12/2003 | Masuda |
| 6,767,411 B2 | 7/2004 | Yeh et al. |
| D495,116 S | 8/2004 | Trocme |
| 6,811,892 B2 * | 11/2004 | Yeh et al. ................ 428/647 |
| 6,814,459 B2 | 11/2004 | Pederson |
| 6,936,859 B1 | 8/2005 | Uemura et al. |
| D521,565 S | 5/2006 | Stewart et al. |
| 7,048,813 B2 | 5/2006 | Miyazaki |
| 7,141,828 B2 | 11/2006 | Venugopalan |
| 7,173,277 B2 | 2/2007 | Tamura et al. |
| 7,247,514 B2 | 7/2007 | Yamane et al. |
| 7,285,801 B2 | 10/2007 | Eliashevich et al. |
| 7,329,905 B2 | 2/2008 | Ibbetson et al. |
| D566,057 S | 4/2008 | Edmond et al. |
| 7,365,371 B2 | 4/2008 | Andrews |
| D582,865 S | 12/2008 | Edmond et al. |
| 7,560,738 B2 | 7/2009 | Liu |
| D599,748 S | 9/2009 | Liu |
| 7,605,403 B2 | 10/2009 | Horio et al. |
| 7,781,323 B2 * | 8/2010 | Shimokawa et al. ....... 438/612 |
| 7,842,959 B2 | 11/2010 | Lee et al. |
| 7,855,459 B2 * | 12/2010 | Slater et al. ................ 257/772 |
| 7,939,839 B2 | 5/2011 | Hasnain |
| 7,947,993 B2 | 5/2011 | Kim et al. |
| 7,982,409 B2 | 7/2011 | Hasnain et al. |
| D645,008 S | 9/2011 | Shan et al. |
| 8,049,242 B2 | 11/2011 | Lin et al. |
| 8,084,775 B2 | 12/2011 | Hasnain et al. |
| 8,178,893 B2 | 5/2012 | Takashima et al. |
| 8,207,543 B2 | 6/2012 | Hasnain |
| 8,395,166 B2 | 3/2013 | Seo et al. |
| 2003/0059972 A1 | 3/2003 | Ikeda et al. |
| 2003/0143103 A1 | 7/2003 | Masuda |
| 2003/0164214 A1 | 9/2003 | Miyazaki |
| 2004/0035909 A1 * | 2/2004 | Yeh et al. ................ 228/56.3 |
| 2005/0104220 A1 * | 5/2005 | Tsuchiya et al. ............ 257/774 |
| 2005/0194605 A1 * | 9/2005 | Shelton et al. ............ 257/99 |
| 2006/0214274 A1 * | 9/2006 | Shimokawa et al. ........ 257/678 |
| 2006/0284191 A1 | 12/2006 | Yang et al. |
| 2007/0048885 A1 | 3/2007 | Jeon |
| 2007/0102693 A1 | 5/2007 | Nagai |
| 2007/0181900 A1 * | 8/2007 | Sato ................ H01L 33/60 257/99 |
| 2007/0253209 A1 | 11/2007 | Loh et al. |
| 2007/0272940 A1 | 11/2007 | Lee et al. |
| 2007/0286762 A1 | 12/2007 | Oppermann |
| 2008/0003777 A1 * | 1/2008 | Slater et al. ............... 438/455 |
| 2008/0006837 A1 * | 1/2008 | Park et al. ................ 257/98 |
| 2008/0099772 A1 | 5/2008 | Shuy et al. |
| 2008/0099777 A1 | 5/2008 | Erchak et al. |
| 2008/0170396 A1 | 7/2008 | Yuan et al. |
| 2008/0179602 A1 | 7/2008 | Negley et al. |
| 2008/0210971 A1 * | 9/2008 | Donofrio et al. ............ 257/99 |
| 2008/0211416 A1 | 9/2008 | Negley et al. |
| 2008/0217640 A1 | 9/2008 | Suzuki et al. |
| 2008/0246051 A1 | 10/2008 | Hosokawa et al. |
| 2009/0001402 A1 | 1/2009 | Sakai |
| 2009/0085048 A1 | 4/2009 | Lee et al. |
| 2009/0179207 A1 | 7/2009 | Chitnis et al. |
| 2009/0224653 A1 | 9/2009 | Wang et al. |
| 2009/0283787 A1 | 11/2009 | Donofrio et al. |
| 2010/0038660 A1 | 2/2010 | Shuja |
| 2010/0051977 A1 | 3/2010 | Kim et al. |
| 2010/0059768 A1 | 3/2010 | Hasnain |
| 2010/0109031 A1 | 5/2010 | Lee et al. |
| 2010/0141175 A1 | 6/2010 | Hasnain et al. |
| 2010/0155746 A1 | 6/2010 | Ibbetson et al. |
| 2010/0163887 A1 | 7/2010 | Kim et al. |
| 2010/0276706 A1 | 11/2010 | Herrmann |
| 2011/0062465 A1 | 3/2011 | Lee et al. |
| 2011/0098420 A1 | 4/2011 | Takizawa et al. |
| 2011/0127563 A1 | 6/2011 | Lin et al. |
| 2011/0147779 A1 | 6/2011 | Kang et al. |
| 2011/0180839 A1 | 7/2011 | Donofrio et al. |

OTHER PUBLICATIONS

Yoon et al. Microstructural evolution of Sn-rich Au—Sn/Ni flip-chip solder joints under high temperature storage testing conditions. 2007. Scripta Materialia. vol. 56. pp. 661-664.*

Mita et al. Effect of Ni on reactive diffusion between Au and Sn at solid-state temperatures. 2006. Materials Science and Engineering B. vol. 126. pp. 37-43.*

Anhock et al. Investigations of Au/Sn alloys on different end-metallizations for high temperature applications. 1998. IEEE/CPMT Berlin Int'l Electronics Manufacturing Technology Symposium. pp. 156-165.*

Harris, J. et al., "Selecting Die Attach Technology for High-Power Applications", *Power Electronics Technology*, Nov. 1, 2009, 6 Pages, Retrieved from the internet http://www.ormetcircuits.com/d/bin-docs/Selecting_Die_Attach_Technology_for_High_Power_Applications.pdf.

International Search Report Corresponding to International Application No. PCT/US12/21253; Date of Mailing: Sep. 6, 2012; 25 Pages.

International Preliminary Report on Patentability corresponding to International Application No. PCT/US2013/023041; Mailing Date: Aug. 14, 2014, 11 pages.

Chuang, R.W. et al., "A Fluxless Au—Sn Bonding Process of Tin-Rich Compositions Achieved in Ambient Air", *2002 Electronic Components and Technology Conference*, pp. 134-137.

International Search Report and Written Opinion Corresponding to International Application No. PCT/US2013/023041; Date of Mailing: Mar. 26, 2013; 12 Pages.

Wikipedia, the free encyclopedia, "Tin", downloaded Apr. 7, 2015 from http://en.wikipedia.org/w/index.php?title=Tim&printable=yes, 15 pp.

* cited by examiner

LOW TEMPERATURE HIGH STRENGTH METAL STACK FOR DIE ATTACHMENT

RELATED APPLICATIONS

The present application is a continuation in part of U.S. patent application Ser. No. 13/011,417; filed Jan. 21, 2011, now U.S. Pat. No. 8698184 entitled "Light Emitting Diodes With Low Junction Temperature And Solid State Backlight Components Including Light Emitting Diodes With Low Junction Temperature," the disclosure of which is incorporated herein by reference in its entirety. The present application is also a continuation in part of U.S. application Ser. No. 11/844,127 filed Aug. 23,2007 entitled "Nickel Tin Bonding System With Barrier Layer For Semiconductor Wafers And Devices," now U.S. Pat. No. 7,910,945, which is a continuation in part of Ser. No. 11/428,158 filed Jun. 30, 2006 now U.S. Pat. No. 8643195 for, "Nickel Tin Bonding System for Semiconductor Wafers and Devices," the disclosures of which are incorporated herein by reference in their entirety.

FIELD

The present application relates to semiconductor device fabrication, and in particular to metal stacks for die attachment of semiconductor devices.

BACKGROUND

Solid state lighting systems including one- or two-dimensional arrays of solid state lighting devices are used for a number of lighting applications. For example, solid state lighting panels including arrays of solid state light emitting devices have been used as direct illumination sources, for example, in architectural and/or accent lighting. Solid state lighting arrays are also commonly used as backlights for small liquid crystal display (LCD) screens, such as LCD display screens used in portable electronic devices. In addition, there has been increased interest in the use of solid state lighting arrays as backlights for larger displays, such as LCD television displays.

A solid state light emitting device may include, for example, a packaged light emitting device including one or more light emitting diodes (LEDs). Inorganic LEDs typically include semiconductor layers forming p-n junctions. Organic LEDs (OLEDs), which include organic light emission layers, are another type of solid state light emitting device. Typically, a solid state light emitting device generates light through the recombination of electronic carriers, i.e. electrons and holes, in a light emitting layer or region.

In an LCD backlight, it is common to arrange LED devices in a linear array on a metal bar, called a "light bar", which is arranged within an LCD backlight unit to emit light parallel to the LCD screen. The light is directed toward the LCD screen by a light guide in the LCD backlight unit.

As LED applications, such a backlighting applications, transition to the use of fewer light sources, the individual light emitting device packages are required to emit more light per package. Accordingly, the present trend is toward using larger and larger size die to accommodate higher light output requirements. Larger LED dice are generally driven at higher forward currents to obtain the desired light output.

Present technology uses LED devices that are attached to packages, heatsinks and/or submounts with silicone die attach. As a die attach material, silicone is not ideal. It is a poor thermal conductor, which may limit the reliability and/or performance of LED die and packages at the higher drive currents needed for higher light output.

Die attach metals may have better thermal conductivity than silicone. However, conventional die attach metals may be unsuited for attachment to plastic packages, such as those used in backlighting applications.

A typical die attach metal is a eutectic Au/Sn alloy, with 80% Au and 20% Sn (by weight). The Au/Sn 80/20 alloy has good mechanical strength, reliability, and thermal conductivity, and is recognized as a standard die attach alloy.

A challenge with the AuSn 80/20 alloy die attach is the requirement of a hot reflow to form the bond, typically in the range of about 305° C. Many plastic packages or chip-on-board packages are adversely affected by exposure to elevated temperatures. The packages may fail catastrophically at temperatures in excess of 300° C., or may suffer material degradation, for example, browning and/or yellowing of the package, which reduces the reflectivity and hence the brightness of the package.

Furthermore, as the number of devices in a lighting unit, such as a light bar, decreases, the overall voltage across the bar may also decrease, resulting in a need to drop the line (supply) voltage further to the operating voltage of the low-voltage bar that includes fewer, larger LED dice. This may require a more complicated power supply that has more dissipation loss, resulting in lower overall system efficiency.

SUMMARY

A packaged light emitting diode according to some embodiments includes a package surface, a semiconductor light emitting diode mounted on the package surface, and a metal stack on the light emitting diode. The metal stack includes a bonding layer on the light emitting diode that contacts the package surface and provides mechanical attachment of the light emitting diode to the package surface. The bonding layer includes gold, tin and nickel. A weight percentage of tin in the bonding layer is greater than 20 percent and a weight percentage of gold in the bonding layer is less than about 75 percent. The weight percentage of tin in the bonding layer may be greater than about 40 percent in some embodiments, and the weight percentage of gold in the bonding layer may be less than 10 percent. A weight percentage of nickel in the bonding layer may be greater than 10 percent in some embodiments.

The thickness of the bonding layer may be greater than about 2 microns, in some embodiments greater than 2.5 microns, and in some embodiments may be at least about 3 microns. The entire metal stack may be less than an 6 microns thick.

The weight percentage of tin in the bonding layer may be less than 80 percent. In some embodiments, the weight percentage of tin in the bonding layer may be between about 75 percent and 80 percent.

The weight percentage of gold the bonding layer may be less than about 5 percent, and in some embodiments, the weight percentage of gold the bonding layer may be less than about 2 percent. The entire metal stack may contain an amount of less than 5 percent by weight.

The bonding layer may include a metal alloy that is more than 90 percent nickel and tin by weight. In some embodiments, the metal alloy of the bonding layer may be more than 95 percent nickel and tin by weight, and in some embodiments more than 97 percent nickel and tin by weight.

The bonding layer may include a metal alloy that is thermally stable at temperatures up to 260 degrees centigrade. In some embodiments, the metal alloy of the bonding layer may be thermally stable at temperatures up to 290 degrees centigrade. In further embodiments, the metal alloy of the bonding layer may be thermally stable at temperatures up to 310 degrees centigrade, and in still further, the metal alloy of the bonding layer may be thermally stable at temperatures up to 320 degrees centigrade.

The barrier layer may be formed of a material and having a thickness sufficient to reduce the formation or migration of free metals or alloys that have melting points lower than 300 degrees centigrade.

A light emitting diode structure according to some embodiments includes a diode region and a metal stack on the diode region. The metal stack includes a barrier layer on the diode region and a bonding layer on the barrier layer. The barrier layer is between the bonding layer and the diode region. The bonding layer includes gold, tin and nickel. A weight percentage of tin in the bonding layer is at least about 70 percent, a weight percentage of gold in the bonding layer is less than about 10 percent, and a weight percentage of nickel in the bonding layer is at least about 19 percent.

Other systems, methods, and/or computer program products according to embodiments of the invention will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1:
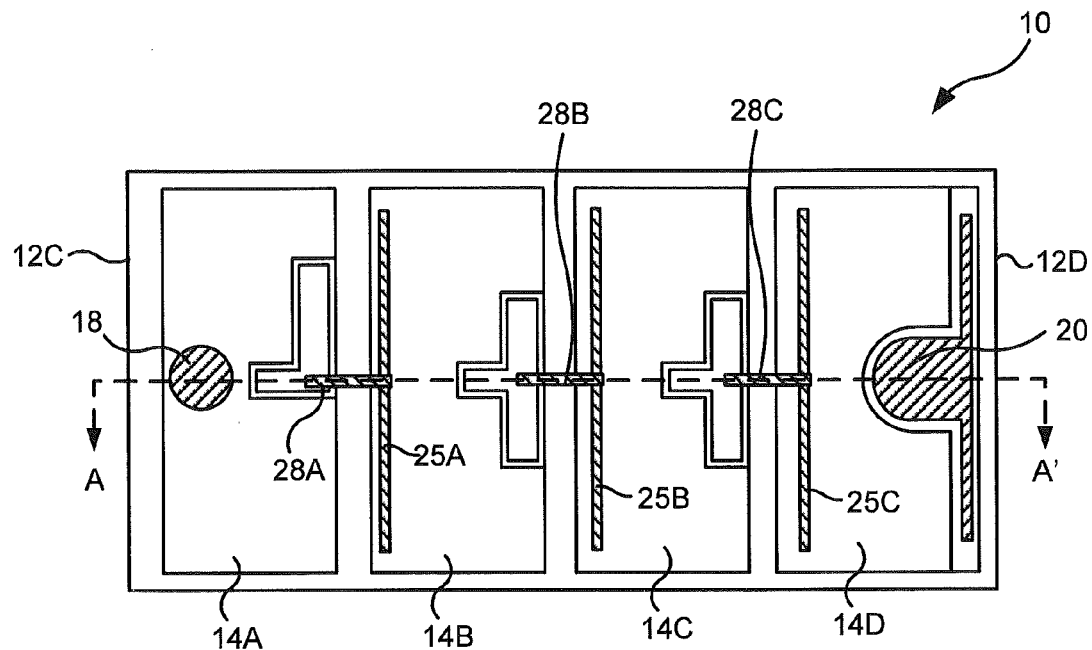
FIG. 1 is a plan view of a light emitting diode structure according to some embodiments.

Embodiments of the present invention are directed towards methods and devices that may improve the thermal characteristics of a solid state lighting apparatus, such as a light bar, and in some cases may reduce the operating temperature of a solid state lighting apparatus. Some embodiments provide a light emitting device die design including a plurality of isolated active junctions configured to be connected in series on the die. Providing a die with multiple junctions that are connected in series may allow the chip to produce a high light output while driving the chip at a relatively low current, thereby reducing the operating temperature of the device. Furthermore, some embodiments provide a metal die attach for a light emitting device die that decreases the thermal resistance of a package incorporating the die, thereby potentially reducing the operating temperature of the device, while permitting the device to be manufactured using a lower temperature reflow that may not adversely affect plastic material in the device package.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "between", "below," "above," "upper," "lower," "horizontal," "lateral," "vertical," "beneath," "over," "on," etc., may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

As noted above, a typical die attach metal is a eutectic Au/Sn alloy, with 80% Au and 20% Sn (by weight). The Au/Sn 80/20 alloy has good mechanical strength, reliability, and thermal conductivity, and is recognized as a standard die attach alloy. However, an AuSn 80/20 alloy die attach may require a reflow in the range of about 305° C., which can adversely affect plastic packages or chip-on-board packages.

Some embodiments provide a metal die attach including an Sn rich structure that reflows at temperatures less than 250° C. In particular, some embodiments provide an AuSn metal die attach that includes about 40% or more (by weight) of Sn. In some embodiments, the weight percent of Sn in the die attach structure may be greater than 60%, and in some embodiments the weight percent of Sn in the die attach structure may be greater than 70%. In some further embodiments, the weight percent of Sn in the die attach structure may be greater than 75%, and in still further embodiments the weight percent of Sn in the die attach structure may be greater than 90%.

In still further embodiments, because gold and tin are layered in the die attach stack, the tin may melt at a lower temperature than an AuSn alloy having a comparable weight percentage of tin. Thus, in some embodiments, the weight percent of tin in the die attach structure may be greater than 20%.

A die attach structure according to some embodiments may reflow and bond at temperatures less than 250° C. The lower reflow temperature of a metal die attach structure as described herein may allow the use of lower reflow temperatures, which may mitigate or reduce the negative effect of high temperature solder reflow on a plastic package body, while providing a metallic submount bond that has enhanced thermal properties, such as reduced thermal resistance, relative to a conventional die attach material, such as silicone.

Moreover, a metal die attach structure as disclosed herein can remain stable during a RoHS (Restriction of Harmful Substances)—compliant package reflow, which allows temperatures up to 260° C. That is, a metal stack according to some embodiments may have a reflow temperature less than about 250° C., but once bonded may remain stable at temperatures above 260° C.

Figure 2:
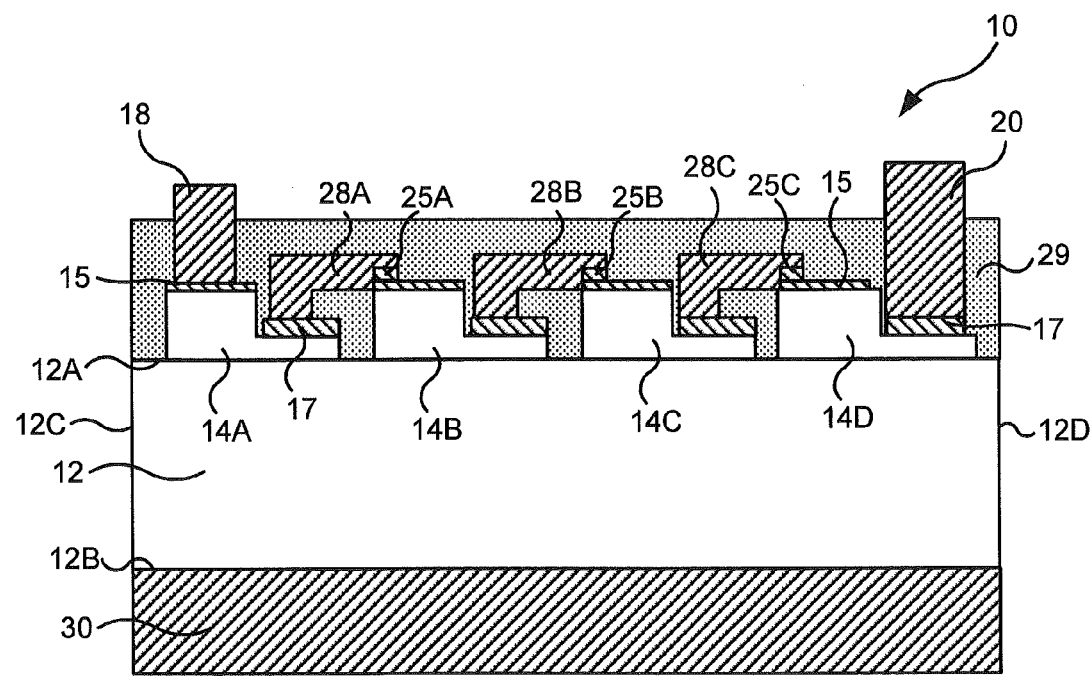
FIG. 2 is a cross-sectional view of a light emitting diode structure according to some embodiments taken along line A-A' of FIG. 1.

FIG. 1 is a plan view of a light emitting diode die (or chip) 10 according to some embodiments, while FIG. 2 is a cross sectional view of a light emitting diode structure according to some embodiments taken along line A-A' of FIG. 1.

Referring to FIGS. 1 and 2, a light emitting diode die 10 according to some embodiments is a unitary semiconductor device that includes a support layer 12 having a first face 12A and a second face 12B opposite the first face 12A. A diode region including a plurality of isolated active regions 14A-14D is on the first face 12A of the support layer 12. The active regions 14A-14D may be isolated from one another by means of mesa isolation (as illustrated in FIGS. 1-2) or other techniques, such as implant isolation, trench isolation, etc.

Each of the active regions 14A-14D may include a single p-n junction. Thus, the light emitting diode die 10 may be referred to as a multi junction die. This structure is not to be confused with a multiple quantum well diode structure, which is well known in the art. A multiple quantum well structure has an active region that may include multiple stacked quantum wells in which recombination occurs to generate light. However, a conventional multiple quantum well structure may still have only a single p-n junction. In contrast, a light emitting diode die 10 according to some embodiments may have multiple isolated active regions, and hence may have multiple isolated p-n junctions.

Each of the isolated active regions includes an anode contact 15 and a cathode contact 17.

A die attach pad 30 is on the second face of the support layer. The bond pad includes a gold-tin structure having a weight percentage of tin of 50% or more.

The light emitting diode die 10 may further include a first wirebond pad 18 on an anode contact 15 of a first one 14A of the isolated active regions and a second wirebond pad 20 on a cathode contact 17 of a second one 14D of the isolated active regions. Moreover, the isolated active regions 14A-14D may be connected in series by means of metal interconnects 28A, 28B and 28C which contact respective current spreading fingers 25A, 25B, 25C on the anode contacts 15. As illustrated in FIG. 2, metal interconnect 28A may electrically connect the cathode contact 17 of the first one 14A of the isolated active regions and the anode contact 15 of the second one 14B of the isolated active regions. Metal interconnect 28B may electrically connect the cathode contact 17 of the second one 14B of the isolated active regions and the anode contact 15 of the third one 14C of the isolated active regions. Similarly, metal interconnect 28C may electrically connect the cathode contact 17 of the third one 14C of the isolated active regions and the anode contact 15 of the fourth one 14D of the isolated active regions. The isolated active regions 14A-14D may be connected in electrical series by the electrical interconnects 28A-28C.

Accordingly, the isolated active regions 14A-14D may be connected in series to form an electronic device having a single anode contact (wire bond pad 18) and a single cathode contact (wire bond pad 20).

The LED die 10 can have many different semiconductor layers arranged in different ways. LED structures and their fabrication and operation are generally known in the art and only briefly discussed herein. The layers of the LED die can be fabricated using known processes with a suitable process being fabrication using metal organic chemical vapor deposition (MOCVD). The layers of the LED die generally include an active layer/region sandwiched between first and second oppositely doped epitaxial layers all of which are formed successively on a growth substrate. LEDs can be formed on a wafer and then singulated for mounting in a package. It is understood that the growth substrate can remain as part of the final singulated LED or the growth substrate can be fully or partially removed, and the epitaxial layers that constitute the diode region can be mounted on a carrier substrate.

It is also understood that additional layers and elements can also be included in the LED die, including but not limited to buffer, nucleation, contact and current spreading layers as well as light extraction layers and elements. The active region can include single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AkGaN, aluminum gallium arsenide (AlGaAs) or aluminum gallium indium arsenide phosphide (AlGaInAsP).

The growth substrate can be made of many materials such at sapphire, silicon carbide, aluminum nitride (AlN), GaN, with a suitable substrate being a 4H polytype of silicon carbide, although other silicon carbide polytypes can also be used including 3 C, 6 H and 15 R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide are typically not limited by the thermal dissipation of the substrate (as may be the case with some devices formed on sapphire).

The LED die can be coated with one or more phosphors with the phosphors absorbing at least some of the LED light and emitting a different wavelength of light such that the device emits a combination of light from the LED and the phosphor. In a preferred embodiment the LED emits a white light combination of LED and phosphor light. The LED die can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LEDs can be coated using other methods such an electrophoretic deposition (EPD), with a suitable EPD method described in U.S. patent application Ser. No. 11/473,089 entitled "Closed Loop Electrophoretic Deposition of Semiconductor Devices", which is also incorporated herein by reference. It is understood that LED packages according to the present invention can also have multiple LEDs of different colors, one or more of which may be white emitting.

Referring again to FIGS. 1 and 2, the support layer 12 may be insulating or semi-insulating, and in some embodiments, the support layer may include semi-insulating silicon carbide, which is available from the assignee Cree, Inc. In some embodiments, the support layer 12 may be a growth substrate on which the epitaxial semiconductor layers that form the isolated active regions 14A-14D are grown. In other embodiments, the support layer may include a carrier layer on which the isolated active regions 14A-14D are supported. In still further embodiments, the support layer may include a layer of a semi-insulating gallium nitride based semiconductor material on which the epitaxial semiconductor layers that form the isolated active regions 14A-14D are grown.

The formation of semi-insulating gallium nitride is well known in the art, and is described, for example in U.S. Pat. No. 7,135,715, the disclosure of which is incorporated herein by reference as if set forth herein.

Semi-insulating SiC may include silicon carbide doped with deep level transition elements, such as vanadium, as described in U.S. Pat. No. 5,856,231, the disclosure of which is incorporated herein by reference as if set forth herein, and/or may include high purity semi-insulating silicon carbide. A high-purity semi-insulating (HPSI) silicon carbide boule may be formed using a seeded sublimation growth technique. Exemplary sublimation growth techniques are more fully described in U.S. Patent Publication No. 2001/0017374 and in U.S. Pat. Nos. 6,403,982, 6,218,680, 6,396,080, 4,866,005 and Re. 34,861, the disclosures of which are hereby incorporated herein by reference. Sublimation techniques may also include gas fed sublimation, continuous growth and high-temperature CVD.

The semiconductor light emitting device may be gallium nitride-based LEDs such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefore. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1.

The light emitting devices may include a substrate that has been thinned, for example, by etching, mechanical lapping or grinding and polishing, to reduce the overall thickness of the structure. Techniques for thinning a substrate are described in U.S. Patent Publication No. 2005/0151138 entitled "Methods Of Processing Semiconductor Wafer Backsides Having Light Emitting Devices (LEDS) Thereon And LEDs So Formed," the disclosure of which is hereby incorporated by reference as if set forth fully herein. Furthermore, a substrate may be shaped or roughened using sawing, laser scribing or other techniques to introduce geometrical features such as angled sidewalls which may increase light extraction. The substrate may be further etched to improve light extraction using for example the etch process described in US. Patent Publication No. 2005/0215000 entitled "Etching Of Substrates Of Light Emitting Diodes," the disclosure of which is hereby incorporated by reference as if set forth fully herein.

Alternatively, the substrate may be remove entirely by substrate removal techniques such as the techniques taught in U.S. Pat. Nos. 6,559,075, 6,071,795, 6,800,500 and/or 6,420,199 and/or U.S. Patent Publication No. 2002/0068201, the disclosures of which are hereby incorporated by reference as if set forth fully herein.

Referring still to FIGS. 1 and 2, in some embodiments, the isolated active regions 14A-14D are arranged in a row extending from a first end 12C of the support layer 12 to a second end 12D of the support layer 12 opposite the first end 12C. In some embodiments, the anode contact 15 of each of the isolated active regions 14A-14D may be provided on a side of the isolated active region nearest the first end 12C of the support layer 12, while the cathode contact 17 of each of the isolated active regions 14A-14D may be provided on a side of the isolated active region nearest the second end 12D of the support layer 12.

The light emitting diode die 10 may further include an insulating layer 29 on the support layer 12 and between respective ones of the active regions 14A-14D. The electrical interconnects 28A-28C may be at least partially provided on portions of the insulating layer 29. Moreover, other portions of the insulating layer 29 may be provided on the active regions 14A-14D and on the interconnects 28A-28C.

The insulating layer 29 may include, for example, an insulating material, such as silicon oxide, silicon nitride, polyimide, or any other suitable insulator. The insulating layer 29 may include a single layer of insulating material and/or may be formed in multiple layers of the same or different material.

In some embodiments, the insulating layer 29 may include an encapsulant material, such as silicone, epoxy resin, or the like. Furthermore, the insulating layer 29 may include phosphor materials, such as those described in U.S. Pat. No. 6,853,010, entitled Phosphor-Coated Light Emitting Diodes Including Tapered Sidewalls and Fabrication Methods Therefore, and/or U.S. Pat. No. 7,821,194, entitled "Solid State Lighting Devices Including Light Mixtures" the disclosures of which are incorporated by reference herein as if set forth fully.

The wirebond pads 18, 20 may extend outside the insulating layer 29 to facilitate electrical contact to the die 10.

Although illustrated in FIGS. 1 and 2 as having four separate isolated active regions, it will be appreciated that a different number of isolated active regions may be formed that is either less than or greater than four. Furthermore, in some embodiments, the light emitting device chip may include only one active region.

Figure 3:
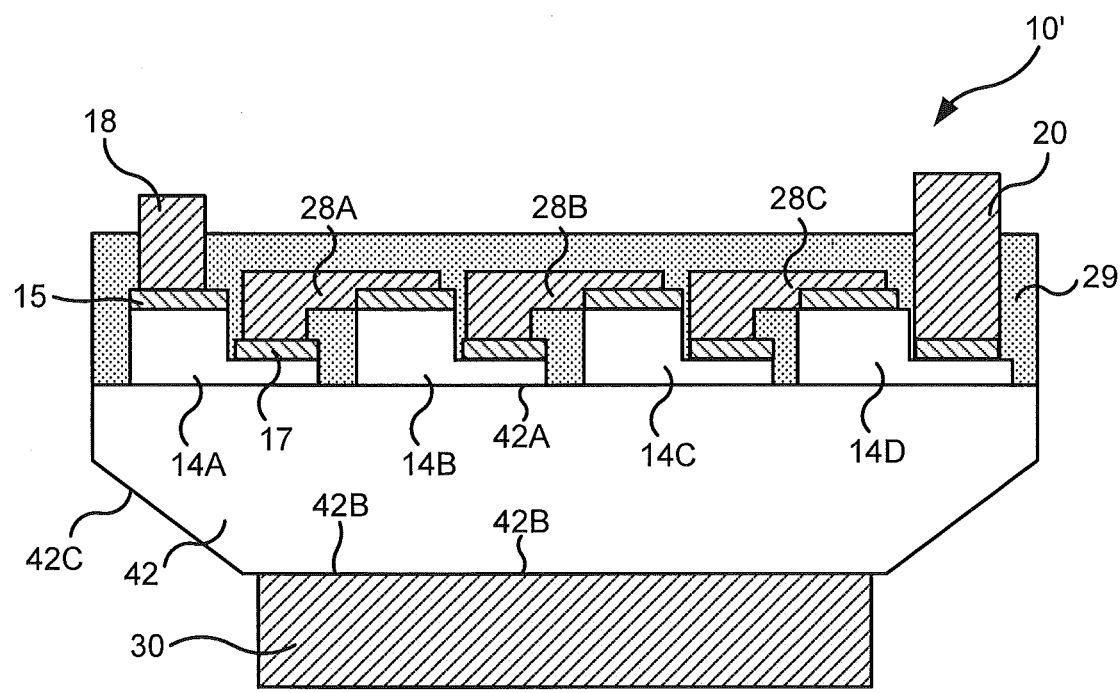
FIG. 3 is a cross-sectional view of a light emitting diode structure according to further embodiments.
Figure 4:
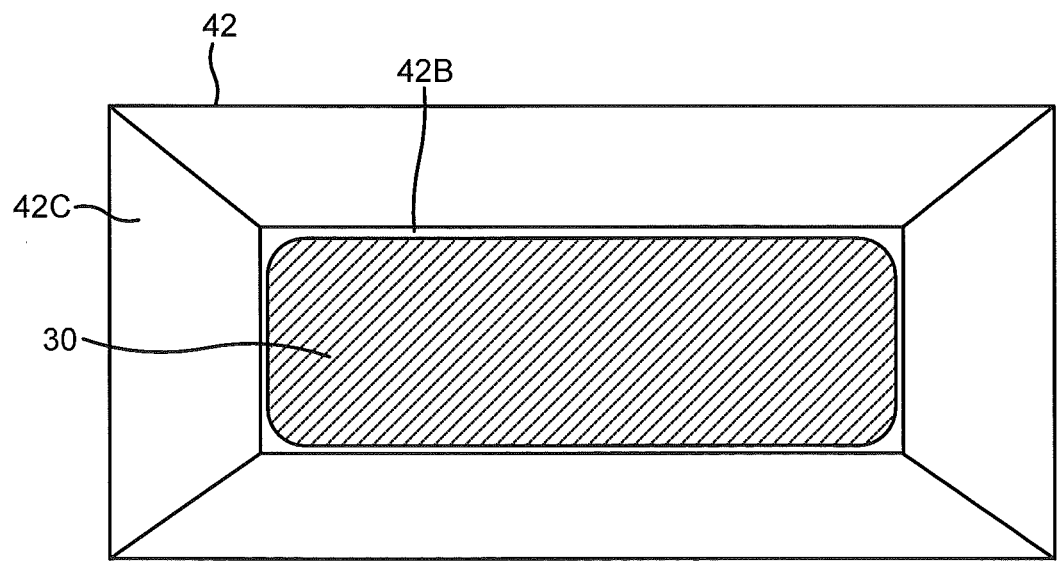
FIG. 4 is a bottom plan view of a light emitting diode structure according to further embodiments.

FIG. 3 is a cross view of a light emitting device die 10' according to further embodiments, and FIG. 4 is a bottom plan view of the light emitting device die 10'.

In the embodiments illustrated in FIGS. 3-4, the isolated active regions 14A-14C, the wirebond pads 18, 20, the metal interconnects 28A-28C, the anodes 15, the cathodes 17 and the insulating layer 29 may all be similar to those described above with respect to FIGS. 1-2.

In the embodiments of FIGS. 3-4, the die 10' includes a support layer 42 that has sidewalls 42C that are angled at an oblique angle to the upper and lower surfaces 42A, 42B of the support layer. In particular, the sidewalls 42C may be angled inwardly from the upper surface 42A on which the isolated active regions are provided to the lower surface 42B of the support layer 42.

The metal die attach pad 30 may be formed on the lower surface 42B and not on the angled sidewalls 42C of the support layer 42 to enhance light extraction when the chip 10' is mounted, for example, to a submount.

Figure 5:
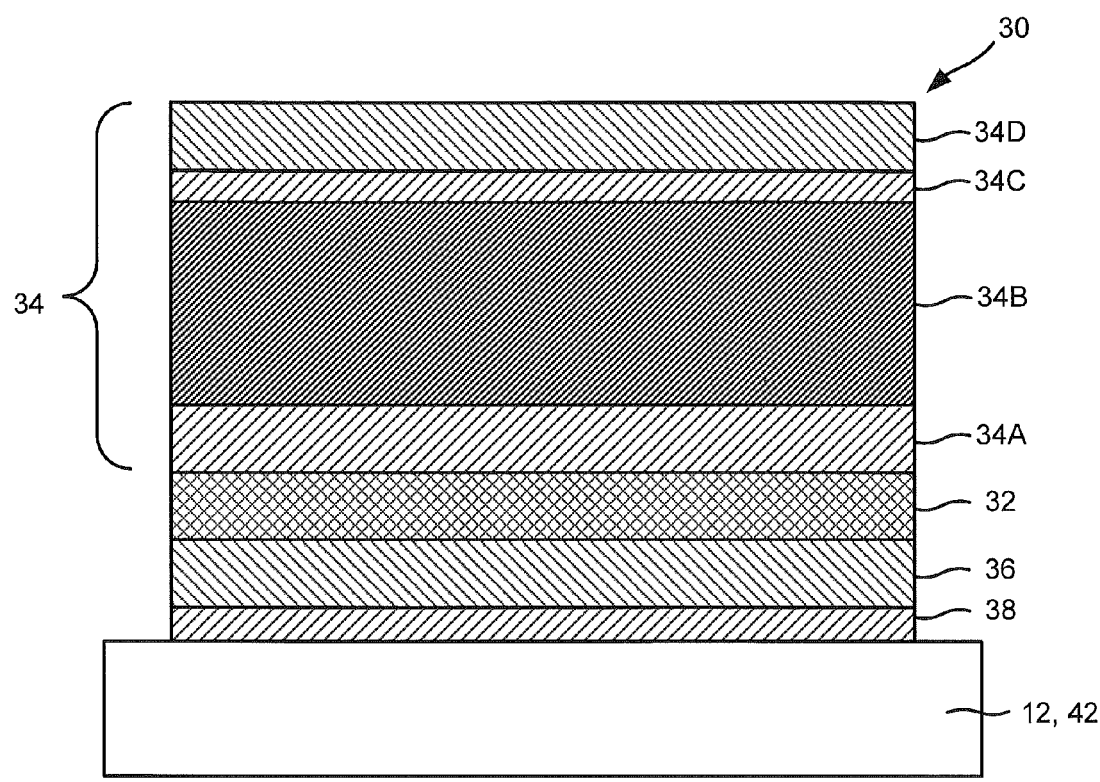
FIG. 5 is a cross-sectional view of a metal bond pad stack according to some embodiments.

FIG. 5 is a cross sectional view of a metal die attach pad 30 according to some embodiments. The die attach pad 30 may include a metal stack including a layer of titanium 38 in direct contact with the support layer 12, 42, a layer of platinum 36 on the titanium layer 38, and a layer of nickel 32 on the platinum layer 36.

The titanium layer 38 may have a thickness of about 0.5 nm to about 25 nm, and in particular may have a thickness of about 10 nm. The purpose of the titanium layer 38 is to promote adhesion.

The platinum layer 36 may have a thickness of about 100 nm to about 500 nm, and in particular may have a thickness of about 250 nm. The purpose of the platinum layer 36 is to reduce tin migration to the titanium layer 38 during the bonding process, and to form a platinum-tin phase with excess molten tin to enhance stability under operation and thermal exposure.

The nickel layer 32 may have a thickness of about 100 nm to about 500 nm, and in particular may have a thickness of about 200 nm. The purpose of the nickel layer 32 is to form a nickel-tin phase with excess molten tin during the bonding process, and to enhance stability under operation and thermal exposure.

The die attach pad 30 further includes a die attach (bonding) layer 34 that includes a first layer of gold 34A, a layer of tin 34B and a second layer of gold 34D. The die attach pad 30 may also include a layer of nickel 34C between the layer of tin 34B and the second layer of gold 34D. The purpose of the nickel layer 34C is to reduce diffusion of gold from the second gold layer 34D into the tin layer 34C during the deposition process. The nickel layer 34C may have a thickness between about 50 nm and about 400 nm, and in particular may have a thickness of about 200 nm.

A thickness of the layer of tin 34B may be about three times a combined thickness of the first layer of gold 34A and the second layer of gold 34D.

The weight percentage of tin in the die attach layer 34 and/or in the die attach pad 30, may be about 40% or more. In some embodiments, the weight percentage of tin in the bond pad may be at least about 50%, and in still further embodiments, the weight percentage of tin in the bond pad may be at least about 60%. In further embodiments, the weight percentage of tin in the bond pad may be at least about 70%, in still further embodiments, the weight percentage of tin in the bond pad may be at least about 75%, and in yet further embodiments, the weight percentage of tin in the bond pad may be at least about 90%.

Other metal layers, including for example one or more reflective layers of silver and/or aluminum, may be provided in the metal stack between the die attach layer 34 and the support layer 12, 42.

Figure 6:
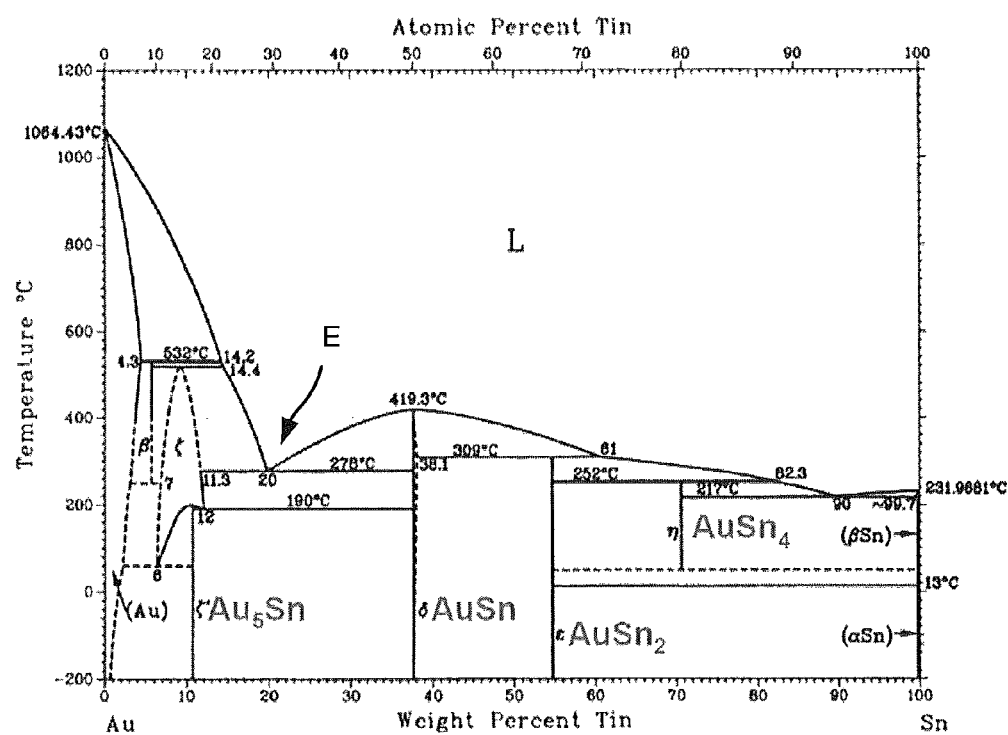
FIG. 6 is a graph of a phase diagram for the Au—Sn material system.

FIG. 6 is a graph of a phase diagram for the Au—Sn material system. In the graph of FIG. 6, temperature is shown on the ordinate (y-axis) while weight percent of tin is shown on the abscissa (x-axis). While not wishing to be bound by a particular theory, it is presently believed that, unlike a conventional 80/20 AuSn alloy, an alloy created during the melting and solidifying of the Au and Sn in the metal die attach pad 30 will not pass through the eutectic point E that exists in the AuSn system at about 20% Sn by weight (corresponding to about 29% tin by atomic percentage), as illustrated in FIG. 6.

Rather, because the slope of the liquidus curve of the AuSn alloy is negative for alloys with more than about 40% Sn by weight, the Au and Sn in the die attach pad 30 will melt at a relatively low temperature as the temperature of the die attach pad 30 is raised, and the high-Sn content melt will then solidify to an alloy that has a melting temperature that is greater than the melting temperature of the 80/20 eutectic alloy, and in particular a melting temperature that is greater than 260° C. Rather, because the metal stack includes a layer of pure tin which has a melting point of about 230° C., a bonding process below 250° C. will be sufficient to melt the tin layer. The molten tin in contact with the gold, nickel, and platinum layers in the stack will solidify as various gold-tin and platinum-tin phases. These phases have higher melting points than pure tin according to their respective phase diagrams, and will therefore be thermally stable up to 260C under operation and thermal exposure.

Figure 7:
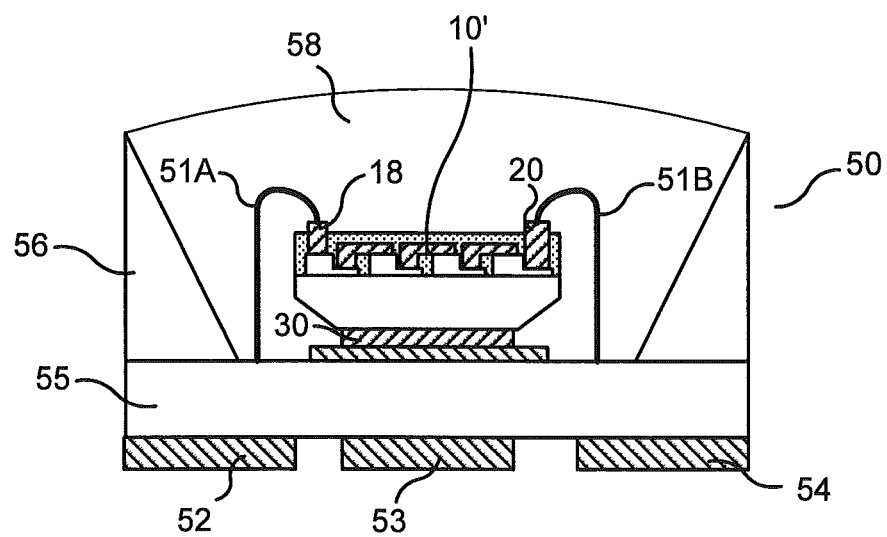
FIG. 7 is a cross-sectional view of a packaged device including a multiple active region light emitting diode according to some embodiments.

FIG. 7 is a cross sectional view of a package 50 including a multiple active region light emitting diode 10' according to some embodiments. The package 50 includes a submount 55, which may include a thermally conductive material, such as aluminum nitride, copper, aluminum or the like. A reflector 56 is on the submount 55 and surrounds a die mounting region on an upper surface of the submount 55. The reflector 56 may be formed of a material that has specular reflective properties, such as aluminum, or it may be formed of a diffuse reflector, such as white plastic.

A multiple active region light emitting diode 10, 10' as described above is mounted on a bond pad or metal bonding region (not shown) in the die mounting region using the metal die attach pad 30 for die attach, and the device 10' is electrically connected to the package through wirebonds to the first and second bond pads 51A, 51B, which are electrically connected to anode and cathode pads 52, 54, respectively, of the package 50, for example, through conductive vias in the submount 55 (not shown).

A separate metal pad 53 may be provided to enhance thermal conduction from the package 50 to an external heat sink (not shown).

Accordingly, a package 50 includes a unitary light emitting diode chip that includes a plurality (e.g. four) separate active regions on a common substrate. The plurality of active regions are connected in series, so that the package 50 may have a single anode contact 52 and a single cathode contact 54.

A package 50 as illustrated in FIG. 7 may have particular advantages when used in a backlight for a liquid crystal display (LCD), because the package may emit an increased amount of light for a given level of current, and the package may have a higher forward voltage drop than a conventional package that includes only one LED chip or two LED chips connected in series.

That is, although it may be known to provide a package including two LED chips connected in series, that is typically only done to increase light output to compensate for low emission power. Such a package may have a forward voltage of about six volts. While a package including two LEDs may be used to increase light output, it is typically undesirable to increase the forward voltage of the package.

In contrast, a package 50 according to some embodiments may have a forward voltage that is greater than about 6 volts. In some embodiments, the package may have a forward voltage of about 9V or more, and in some embodiments the package may have a forward voltage of about 12 volts or more. Accordingly, a plurality of packages 50 may be provided in series in a structure, such as an LCD backlight unit. The packages 50 may each have a high level of light emission and also a high forward voltage, so that the overall forward voltage of the series may be better matched to the output voltage of a DC power supply that provides current to the LED structure.

Figure 8:
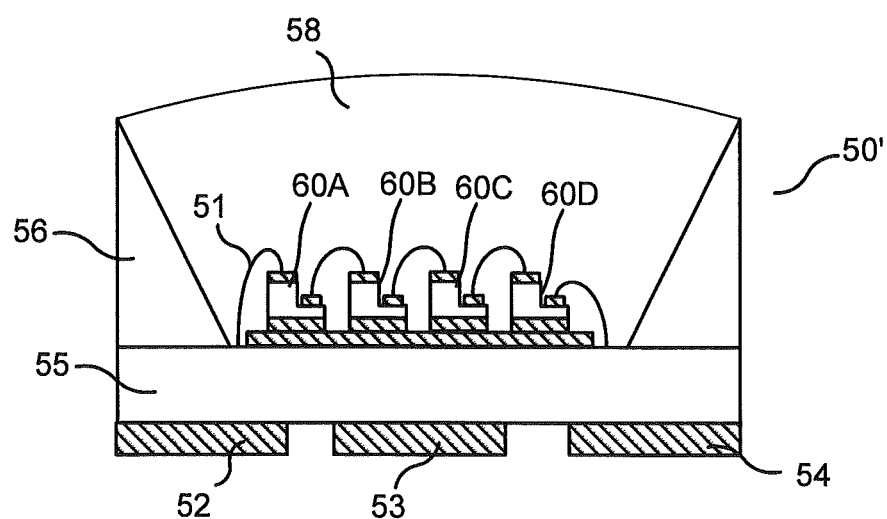
FIG. 8 is a cross-sectional view of a packaged device including multiple single active region light emitting diodes according to some embodiments.

FIG. 8 is a cross sectional view of a packaged device 50' including multiple single active region light emitting diodes according to further embodiments. The package 50' is similar to the package 50 illustrated in FIG. 7. However, instead of one multi junction LED chip, the package 50 includes a plurality of singulated single junction LED chips 60A-60D connected in electrical series by wirebonds 51. A package 50' may have similar advantages for use in LCD backlighting, as the package may generate increased light output for a given level of current while having a higher forward voltage drop over a single packaged component.

Figure 9:
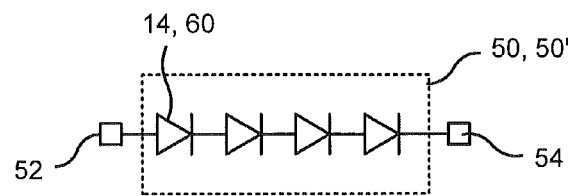
FIG. 9 is a schematic diagram of a packaged device according to some embodiments.

FIG. 9 is a schematic diagram of a packaged device 50, 50' according to some embodiments. As shown in FIG. 9, a packaged device 50, 50' may include a single package body having a single anode contact 52 and a single cathode contact 54 made to a group of light emitting diode junctions 14, 60 coupled in electrical series.

Figure 10:
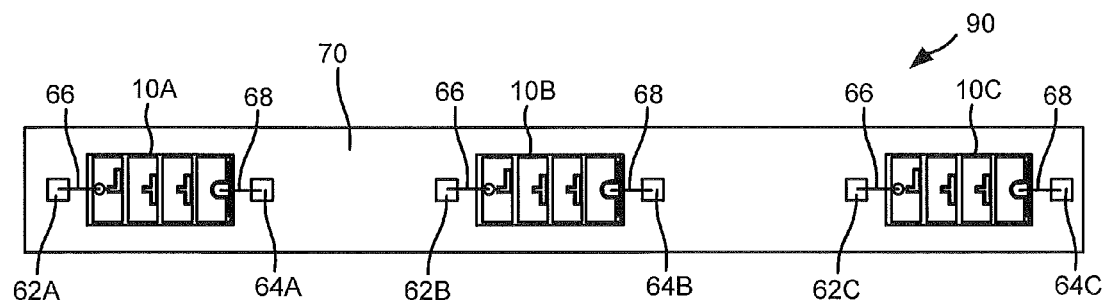
FIGS. 10 and 11 are plan views of a light bars including a plurality of light emitting diodes according to some embodiments.

FIG. 10 is a plan view of a light bar 90 including a plurality of light emitting devices 10 according to some embodiments.

A light bar 90 according to some embodiments includes an elongated support member 70, and a plurality of light emitting devices 10A-10C mounted on the elongated support member 70. Each of the light emitting diode chips 10A-10C may have a structure as illustrated in FIGS. 1-4. Thus, each of the light emitting diode chips 10A-10C may include a support layer 12, 42 having a first face and a second face opposite the first face, a diode region on the first face of the support layer 12, 42, and a die attach pad 30 on the second face of the support layer 12, 42. Each of the bond pads includes a gold-tin structure having a weight percentage of tin greater than 40%. The light emitting diode chips 10A-10C are mounted to the elongated support member by their respective bond pads 30, so that heat generated during operation of the light emitting devices 10A-10C may be at least partially dissipated through the light bar.

The light emitting diode chips 10A-10C may be connected in electrical series via anode and cathode contacts 62A-62C, 64A-64C as illustrated in FIG. 10. thus, the active regions 14A-14D of each of the light emitting diode chips 10A-10C may be connected in electrical series. Light output from the light bar 90 may thereby enhanced even though the light bar includes fewer light emitting devices 10A-10C, because the light bar 90 still includes a large number of active regions 14A-14D. Moreover, the light bar can be run at lower current than a light bar having a similar number of conventional light emitting devices with similar active junction areas. Also, the overall level of voltage that is applied to be light bar 90 may be better matched to an external power supply, so that less voltage must be dropped outside the light bar, thereby decreasing the complexity of a system in which the light bar is used.

Figure 11:
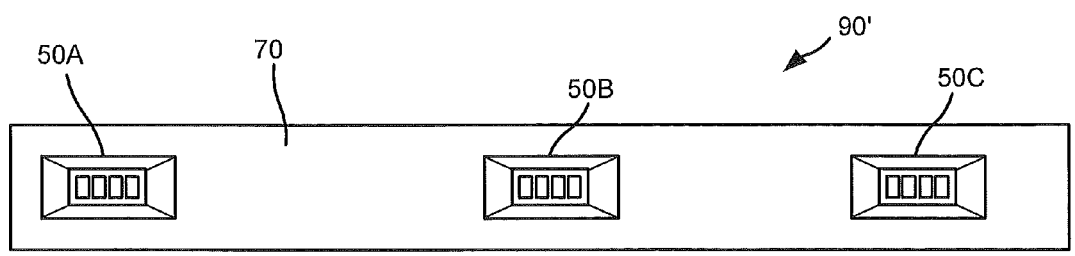

FIG. 11 is a plan view of a light bar 90' including a plurality of multiple emitter light emitting diode packages 50A to 50C according to some embodiments. The LED packages 50A to 50C may have a structure similar to the package 50 illustrated in FIG. 7 and/or the package 50' illustrated in FIG. 8. The LED packages 50A to 50C may be connected in electrical series. Accordingly, the light bar 90' may have fewer light emitters (the packaged devices 50A to 50C) with higher light emission and higher forward voltage than a light bar that included packages with only one or two LED junctions per package.

Figure 12:
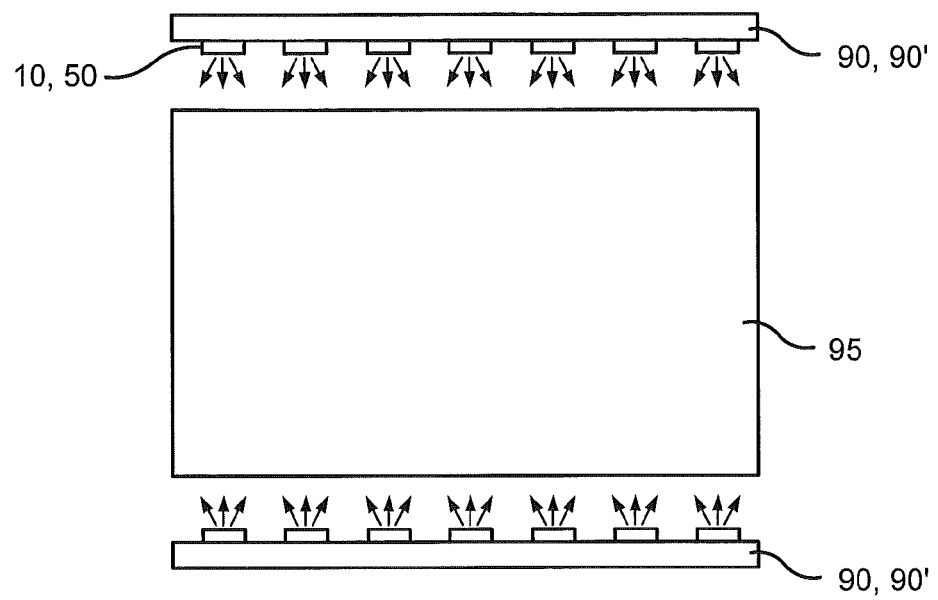
FIG. 12 is a schematic diagram illustrating a backlight assembly for a liquid crystal display screen.
Figure 13:
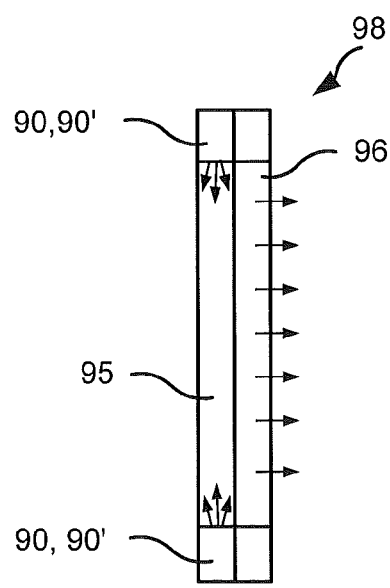
FIG. 13 is a side cross-sectional view of a liquid crystal diode display according to some embodiments.

FIG. 12 is a partial exploded diagram illustrating portions of a backlight assembly for a liquid crystal display screen, while FIG. 13 is a side cross sectional view of an LCD display panel 98 according to some embodiments. As shown therein, a backlight assembly may include a diffuser sheet 95 and a plurality of light bars 90, 90', each including a plurality of light emitters 10, 50 arranged in a linear array to transmit light into an edge of the diffuser sheet 95. Light emitted by the light bars 90, 90' is diffused by the diffuser sheet and transmitted in a direction normal to the figure shown in FIG. 12 into an LCD screen 96 to provide backlighting for the LCD screen 96.

Figure 14A:
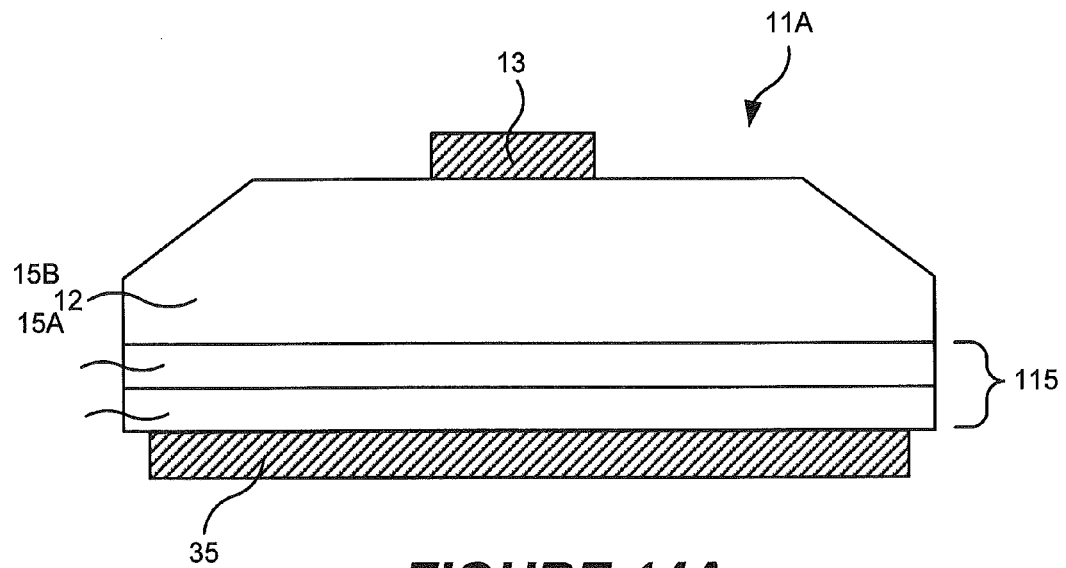
FIGS. 14A, 14B and 14C are cross-sectional views of light emitting diode structures according to further embodiments.
Figure 14B:
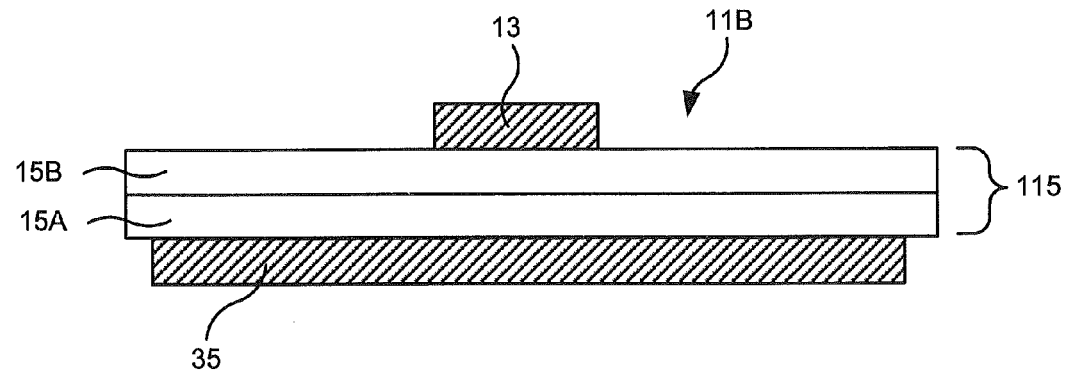
Figure 14C:
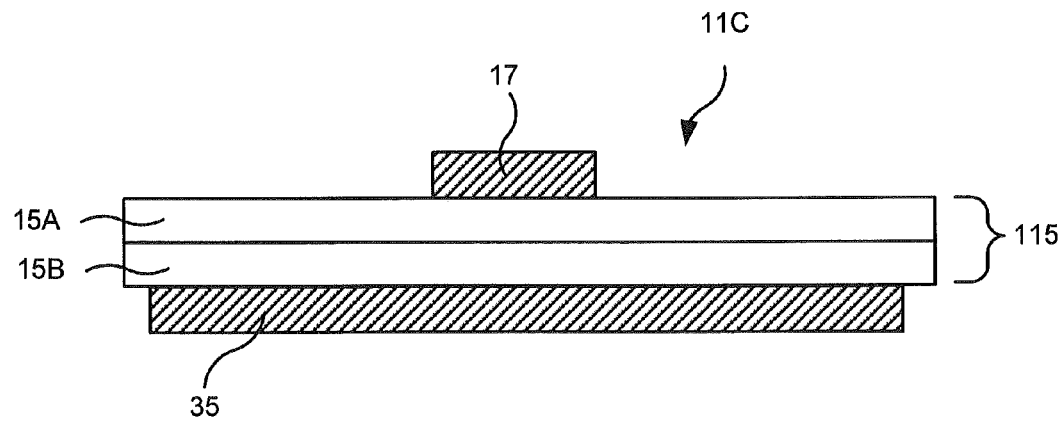

FIGS. 14A, 14B and 14C are cross views of light emitting diode structures according to further embodiments. In particular, the light emitting diode structures 11A and 11B may be mounted in a flip-chip configuration. Referring to FIG. 14A, the light emitting diode structure 11A may include a substrate 12, which may be a growth substrate or a carrier substrate on which an active region 115 is provided. The active region 115 may include a p-type epitaxial region 15A and an n-type epitaxial region 15B layered on the substrate 12. A cathode contact 13 is on the substrate 12, while a die attach pad 35 is on the p-type epitaxial region 15A and provides an anode contact for the diode 11A. The die attach pad 35 may have a structure as described above with respect to FIG. 5, and, accordingly, may be configured to reflow at low temperatures but solidify to provide a bond that is stable at high temperatures.

Referring to FIG. 14B, the light emitting diode structure 11B may be similar to the light emitting diode structure 11A, except that the substrate 12 has been removed using conventional substrate removal techniques.

Referring to FIG. 14C, the light emitting diode structure 11C may be similar to the light emitting diode structure 11B, except that the die attach pad 35 is on the n-type epitaxial region 15B and an anode contact 17 is on the p-type epitaxial region 15A.

Embodiments of the present invention may be particularly suitable for direct die attach mounting of an LED die to a package including a submount.

Figure 15:
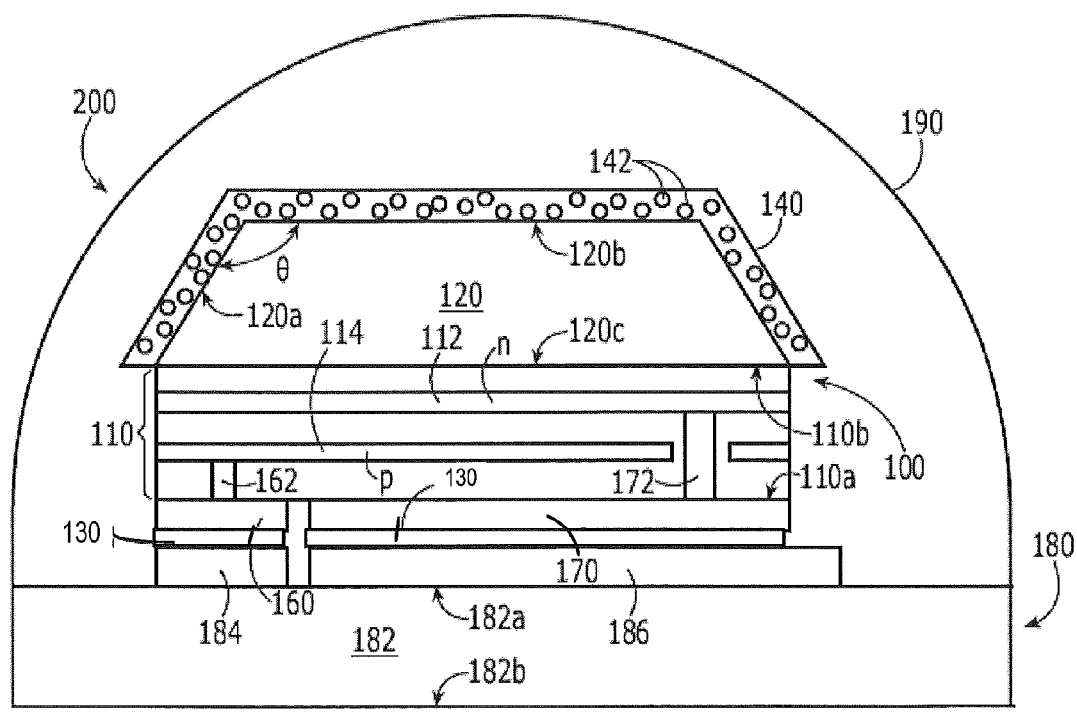
FIG. 15 is a cross-sectional view of an LED die according to some embodiments mounted in a package.

An LED die 100 mounted by direct die attachment in a package 200 is illustrated in FIG. 15. Referring to FIG. 15, the LED die 100 includes a diode region 110 having first and second opposing faces 110a, 110b, respectively, and including therein an n-type layer 112 and a p-type layer 114. Other layers or regions may be provided, which may include quantum wells, buffer layers, etc., that need not be described herein. An anode contact 160 ohmically contacts the p-type layer 114 and extends on a first face 110a. The anode contact 160 may directly ohmically contact the p-type layer 114, or may ohmically contact the p-type layer 114 by way of one or more conductive vias 162 and/or other intermediate layers. A cathode contact 170 ohmically contacts the n-type layer 112 and also extends on the first face 110a. The cathode contact may directly ohmically contact the n-type layer 112, or may ohmically contact the n-type layer 112 by way of one or more conductive vias 172 and/or other intermediate layers. As illustrated in FIG. 15, the anode contact 160 and that cathode contact 170 that both extend on the first face 110a are coplanar. The diode region 110 also may be referred to herein as an "LED epi region", because it is typically formed epitaxially on a substrate 120. For example, a Group III-nitride based LED epitaxial structure 110 may be formed on a silicon carbide growth substrate. In some embodiments, as will be described below, the growth substrate may be present in the finished product. In other embodiments, the growth substrate may be removed. In still other embodiments, another substrate may be provided that is different from the growth substrate.

As also shown in FIG. 15, a transparent substrate 120, such as a transparent silicon carbide growth substrate, is included on the second face 110b of the diode region 110. The transparent substrate 120 includes a sidewall 120a and may also include an inner face 120c adjacent the second face 110b of the diode region 110 and an outer face 120b, remote from the inner face 120c. The outer face 120b is of smaller area than the inner face 120c. In some embodiments, the sidewall 120a may be stepped, beveled and/or faceted, so as to provide the outer face 120b that is of smaller area than the inner face 120c. In other embodiments, as shown in FIG. 15, the sidewall is an oblique sidewall 120a that extends at an oblique angle θ, and in some embodiments at an obtuse angle, from the outer face 120b towards the inner face 120c.

An LED die 100 configured as described above in connection with FIG. 15 may be referred to as "horizontal" or "lateral" LEDs, because both the anode and the cathode contacts thereof are provided on a single face of the LED. Horizontal LEDs may be contrasted with vertical LEDs in which the anode and cathode contacts are provided on opposite faces thereof.

Various other configurations of horizontal LEDs that may be used according to any of the embodiments described herein, are described in detail in U.S. Patent Application publication 2009/0283787 to Donofrio et al., entitled "Semiconductor Light Emitting Diodes Having Reflective Structures and Methods of Fabricating Same," ("the '787 Publication") assigned to the assignee of the present application, the disclosure of which is hereby incorporated herein by reference in its entirety as if set forth fully herein.

Still continuing with the description of FIG. 15, a conformal layer 140 that comprises phosphor particles 142, is provided on the outer face 120b and on the oblique sidewall 120a. In embodiments of FIG. 15, the entire outer face 120b and the entire oblique sidewall 120a are covered with the phosphor layer 140. However, in other embodiments, the entire outer face 120b and/or the entire oblique sidewall 120a need not be covered with the phosphor layer 140. Moreover, the conformal phosphor layer 140 may be of uniform thickness on the outer face 120b and on the oblique sidewall 120a.

Various embodiments of phosphor layers 140 and diode regions 110 may be provided according to various embodiments described herein. For example, in some embodiments, the diode region 110 is configured to emit blue light, for example light having a dominant wavelength of about 450-460 nm, and the conformal layer comprises yellow phosphor, such as YAG:Ce phosphor.

In other embodiments, the diode region 110 is configured to emit blue light upon energization thereof, as described above, and the conformal layer 140 may comprise a mixture of a yellow phosphor and red phosphor, such as a CASN-based phosphor. Continuing with the description of FIG. 15, the LED die 100 may be combined with a mounting substrate or submount 180 and a lens 190 to provide a packaged LED 200. The submount 180 may include a submount body 182 that may comprise aluminum nitride (AlN). In other embodiments, metal core substrates, printed circuit boards, lead frames and/or other conventional mounting substrates may be used to mount the LED die 100 in a flip-chip configuration. The submount 180 includes a submount face 182a, and an anode pad 184 and a cathode pad 186 thereon. The anode and cathode pads may comprise silver-plated copper and/or other conductive materials. As illustrated in FIG. 15, the LED die 100 is mounted on the submount 180, such that the first face 110a is adjacent the submount face 182a, the outer face 110b is remote from the submount 180, the anode contact 184 is adjacent the anode pad 160, and the cathode contact 186 is adjacent the cathode pad 170.

A metal stack 130 including a bonding layer as described herein is used to electrically, thermally and mechanically connect the anode contact 160 to the anode pad 184, and the cathode contact 170 to the cathode pad 186. In other embodiments, direct attachment of the anode contact 160 to the anode pad 184, and direct attachment of the cathode contact 170 to the cathode pad 186 may be provided, for example using thermocompression bonding and/or other techniques.

A packaged device anode 192 and a packaged device cathode 194 may be provided on package surface, such as a second face 182b of the submount body 182, and may be connected to the anode pad 184 and cathode pad 186, respectively, using internal vias and/or conductive layers that extend on and/or around the submount body 182.

The submount body 182 can be formed of many different materials with a preferred material being electrically insulating. Suitable materials include, but are not limited to ceramic materials such as aluminum oxide, aluminum nitride or organic insulators like polyimide (PI) and polyphthalamide (PPA). In other embodiments the submount body 182 can include a printed circuit board (PCB), sapphire or silicon or any other suitable material. For PCB embodiments different PCB types can be used such as standard FR-4 PCB, metal core PCB, or any other type of printed circuit board. As more fully described below, LED packages according to the present invention can be fabricated using a method that utilizes a submount panel sized to accommodate a plurality of submounts. Multiple LED packages can be formed on the panel, with the individual packages being singulated from the panel.

Various embodiments of submounts 180 that may be used with embodiments described herein, are described in the '787 Publication that was cited above. Various other embodiments of submounts 180 are described in U.S. Patent Application Publication 2009/0108281 to Keller et al., entitled Light Emitting Diode Package and Method for Fabricating Same, assigned to the assignee of the present application, the disclosure of which is hereby incorporated herein by reference in its entirety as if set forth fully herein (hereinafter referred to as "the '281 Publication"). It will be understood that any and all embodiments of these submounts may be used in embodiments of FIG. 15. However, the pad structure on the submount may be modified so as to be used with a horizontal LED die 100 of FIG. 15, rather than the vertical LEDs described in the '281 Publication.

Finally, the packaged LED 200 may also include a lens 190 that extends from submount face 180a to surround the LED die 100. The lens 190 may be a molded plastic lens, as described in detail in the '281 Publication, and may be fabricated on the submount according to techniques that are described in the '281 Publication, and/or other techniques. In some embodiments, the lens may be about 3.06 mm in diameter.

Figure 16:
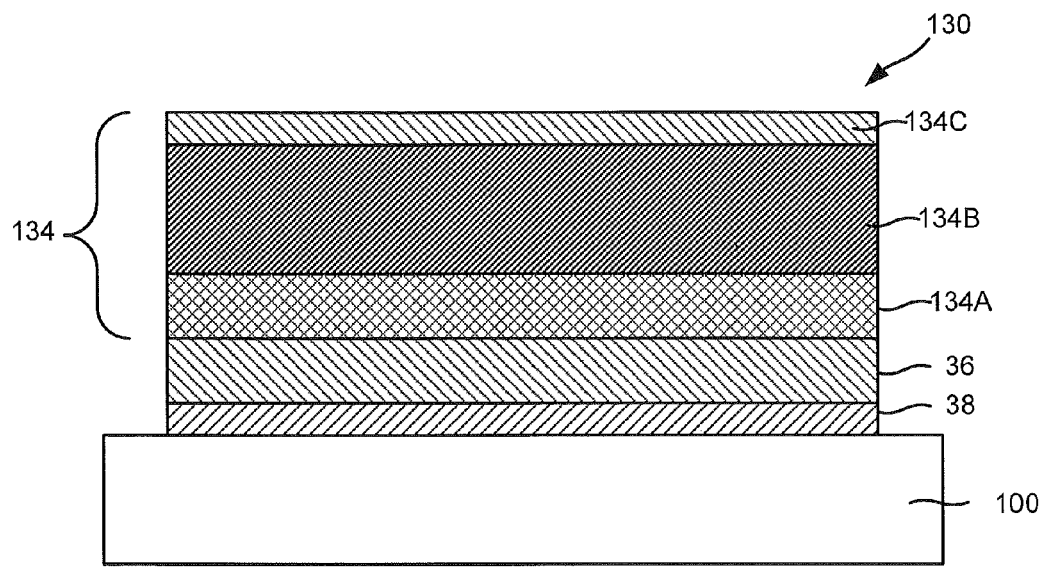
FIG. 16 is a cross-sectional view of a metal die attach pad according to some embodiments on a generic semiconductor LED die.

FIG. 16 is a cross sectional view of a metal die attach pad 130 on a generic semiconductor LED die 100 according to some embodiments. The die attach pad 130 may include a metal stack including an adhesion layer of, e.g., titanium 38 in direct contact with the LED die 100, and a barrier layer of, e.g., platinum 36 on the adhesion layer 38. The adhesion layer 38 may have a thickness of about 5 nm to about 250 nm, and in particular may have a thickness of about 50 nm. The barrier layer 36 may have a thickness of about 100 nm to about 500 nm, and in particular may have a thickness of about 150 nm. As in the embodiment above, the purpose of the barrier layer 36 is to reduce tin migration to the titanium layer 38 during the bonding process. The barrier layer 36 may be formed of a material and having a thickness sufficient to substantially preclude the formation or migration of free metals or alloys that have melting points lower than 300 degrees centigrade. In particular, a platinum barrier layer may form a platinum-tin phase with excess molten tin to enhance stability under operation and thermal exposure.

Other materials/metals may be present in the metal stack 130. For example, the metal stack 130 may include a reflector layer that may be surrounded by a barrier layer to protect the reflective layer. The metal stack 130 may also include a metal that forms an ohmic contact with an underlying semiconductor layer.

A bonding layer 134 is provided on the barrier layer 36. The bonding layer 134 includes a layer of nickel 134A on the barrier layer 36, a layer of tin 134B on the nickel layer 134A, and a layer of gold 134C on the tin layer 134B.

In some embodiments, it may be desirable to reduce the amount of gold in the bonding layer. Reducing the amount of gold in the bonding layer can reduce the overall cost of the device, due to the relatively high cost of gold. It is still desirable to provide a thin layer of gold on the metal stack to inhibit oxidation of the metal stack during the manufacturing process. However, reducing the amount of gold in the bonding layer can change the physical and/or mechanical characteristics of the bonding layer.

It is desirable for the bonding layer to reflow at relatively low temperatures when the LED die 100 is initially mounted to a carrier substrate, PCB, header, etc. Although the constituent layers 134A-134C of the bonding layer are deposited as discrete layers, once the device has been bonded, the bonding layer forms an alloy of metals that may have a different melting point than the individual metals have. It is desirable for the melting point of the alloyed bonding layer to be high enough for the bonding metal to be able to withstand subsequent high temperature processing steps, such as might be encountered during lead-free soldering. Accordingly, it is desirable for the alloyed bonding layer to have a melting point that is at least about 250 degrees centigrade, and in some cases higher than 260 degrees centigrade.

In addition to thermal stability, it is also important for the metal of the bonding layer 134 to have a high shear strength to enable the die attachment to survive mechanical stress, such as may be encountered during subsequent processing steps and/or during use of the device, without delaminating.

According to some embodiments, a bonding layer having a weight percentage of tin of at least about 20 percent, and in some cases at least about 40 percent, and a weight percentage of gold less than about 75 percent and in some cases less than 10 percent. A weight percentage of nickel in the bonding layer may be at least about 10 percent. A bonding layer having such a composition may have desirable thermal and/or mechanical characteristics, particularly for bonding an LED chip to a submount in a device package.

Increasing the thickness of tin in the metal stack to greater than 2 microns, and in some cases up to 3 microns or more, can reduce the formation of voids during the attachment process, which may improve the thermal resistance of the metal stack.

In some embodiments, in order to achieve the desired thermal stability and/or shear strength, the nickel layer 134A may have a thickness greater than about 400 nm, and in particular may have a thickness of about 600 nm. Because tin is relatively soft, it may be desirable to increase the amount of nickel in the bonding layer to increase the mechanical strength of the bonding layer.

The thickness of the layer of tin 34B may be greater than about 2 microns (2000 nm), in some cases greater than about 2.5 microns (2500 nm) and in some cases may be at least about 3 microns (3000 nm).

The entire metal stack, including adhesion, barrier, bonding and other layers, may be less than an 6 microns thick to enhance the mechanical stability of the die attach.

In some embodiments, the weight percentage of tin in the bonding layer may be less than 80 percent. In some embodiments, the weight percentage of tin in the bonding layer may be between about 70 percent and 80 percent.

The weight percentage of gold the bonding layer 134 may be less than about 5 percent, and in some embodiments, the weight percentage of gold the bonding layer may be less than about 2 percent. The entire metal stack 130 may contain gold in an amount of less than 5 percent by weight.

The bonding layer may include a metal alloy that is more than 90 percent nickel and tin by weight. In some embodiments, the metal alloy of the bonding layer may be more than 95 percent nickel and tin by weight, and in some embodiments more than 97 percent nickel and tin by weight.

Prior to initial bonding, the bonding layer may have a relatively low initial melting temperature. For example, the initial melting temperature of the bonding layer may be less than 250 degrees centigrade. In some embodiments, the initial melting temperature of the bonding layer may be less than 240 degrees centigrade and in some embodiments less than 230 degrees centigrade.

After bonding, the bonding layer may include a metal alloy that is thermally stable at temperatures up to 260 degrees centigrade. In some embodiments, the metal alloy of the bonding layer may be thermally stable at temperatures up to 290 degrees centigrade. In further embodiments, the metal alloy of the bonding layer may be thermally stable at temperatures up to 310 degrees centigrade, and in still further, the metal alloy of the bonding layer may be thermally stable at temperatures up to 320 degrees centigrade.

Figure 17A:
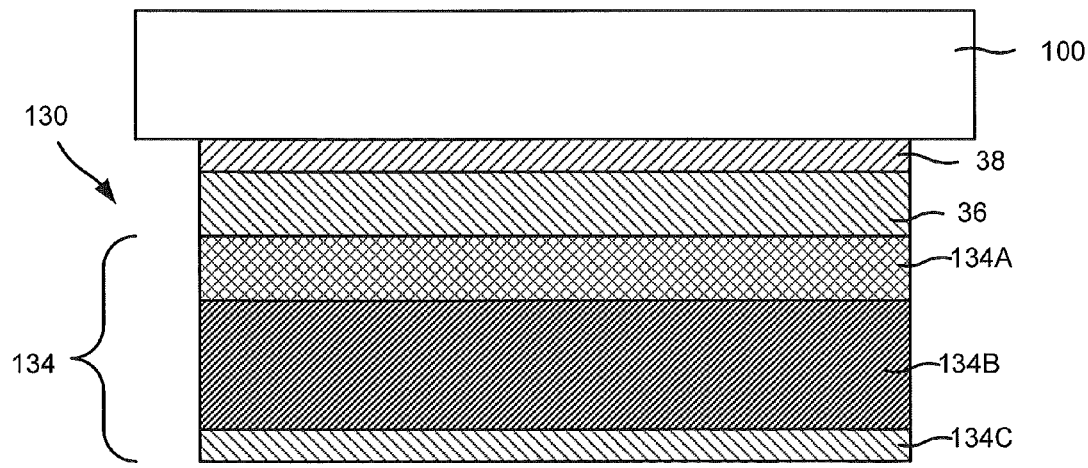
FIGS. 17A and 17B illustrate direct die attachment of an LED die including a metal stack according to some embodiments.
Figure 17A:
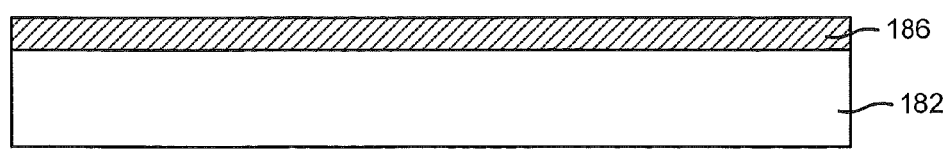
Figure 17B:
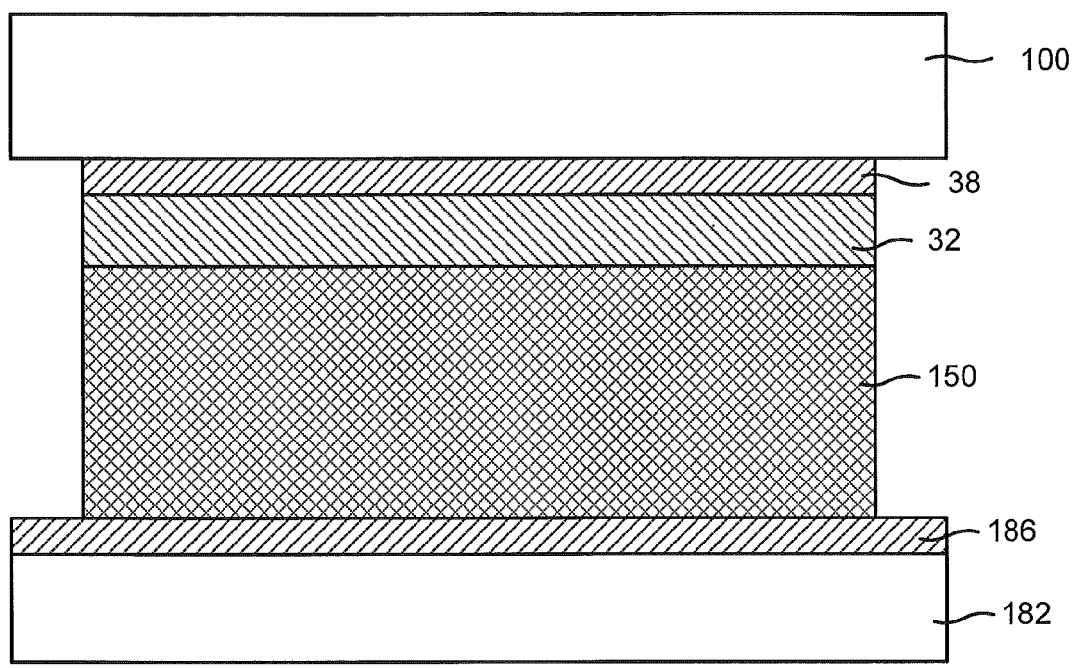

Referring to FIGS. 17A and 17B, the LED die 100 including the metal stack 130 may be bonded onto a submount body 182, including a metal die attach pad 186.

The submount body 182 has a top surface including patterned conductive features that can include a die attach pad 186. The LED can be mounted to the die attach pad 186 using known methods and material mounting such as using conventional solder materials that may or may not contain a flux material or dispensed polymeric materials that may be thermally and electrically conductive.

The size of the submount body 182 can vary depending on different factors, with one being the size of the LED. For example, the size of the package can be essentially of the same dimension as the effective heat spreading area in the attach pad. In a package having a 1 mm LED die, the submount can be approximately 3.5 mm by 3.5 mm; with a package having a 0.7 mm die it can be 3.2 mm by 3.2 mm and generally of square shape in both cases. It is further understood that the submount can have other shapes including circular, rectangular or other multiple sided shapes.

The die attach pad 186 can include much different material such as metals or other conductive materials. In one embodiment the attach pad 186 includes copper deposited using known techniques such as plating. In typical plating process a titanium adhesion layer and copper seed layer are sequentially sputtered onto a substrate. Then, approximately 75 microns of copper is plated onto the copper seed layer. The resulting copper layer being deposited can then be patterned using standard lithographic processes. In other embodiments the layer can be sputtered using a mask to form the desired pattern. In further embodiments a capping layer of silver can be formed over the copper layer.

The die attach pad 186 can be plated or coated with additional metals or materials to the make the die attach pad 186 more suitable for mounting an LED die 100. For example, the die attach pad 186 can be plated with adhesive or bonding materials, or reflective and barrier layers.

When the LED die 100 including the metal stack 130 is brought into contact with the metal die attach pad 186 and sufficient energy (heat, pressure, vibration, etc.) is applied to the LED die 100, the bonding layer melts, and the constituent layers of the bonding layer alloy to form an alloyed bonding layer 150 that is in some embodiments an alloy of nickel, tin and gold.

Figure 18A:
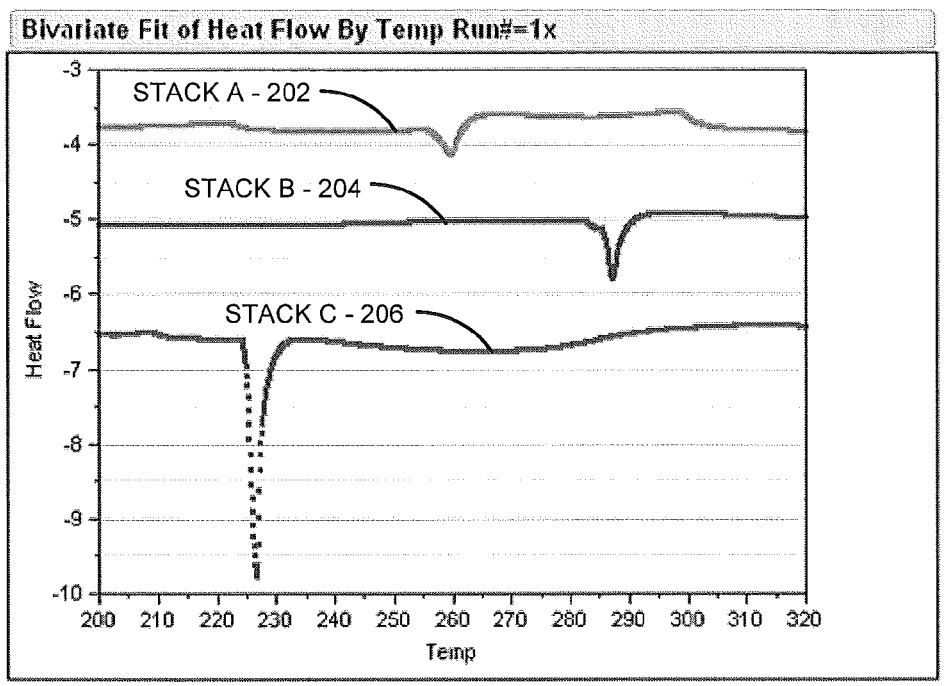
FIGS. 18A and 18B are graphs of differential scanning calorimetry (DSC) results for several different metal stacks including a metal stack according to the present invention.
Figure 18B:
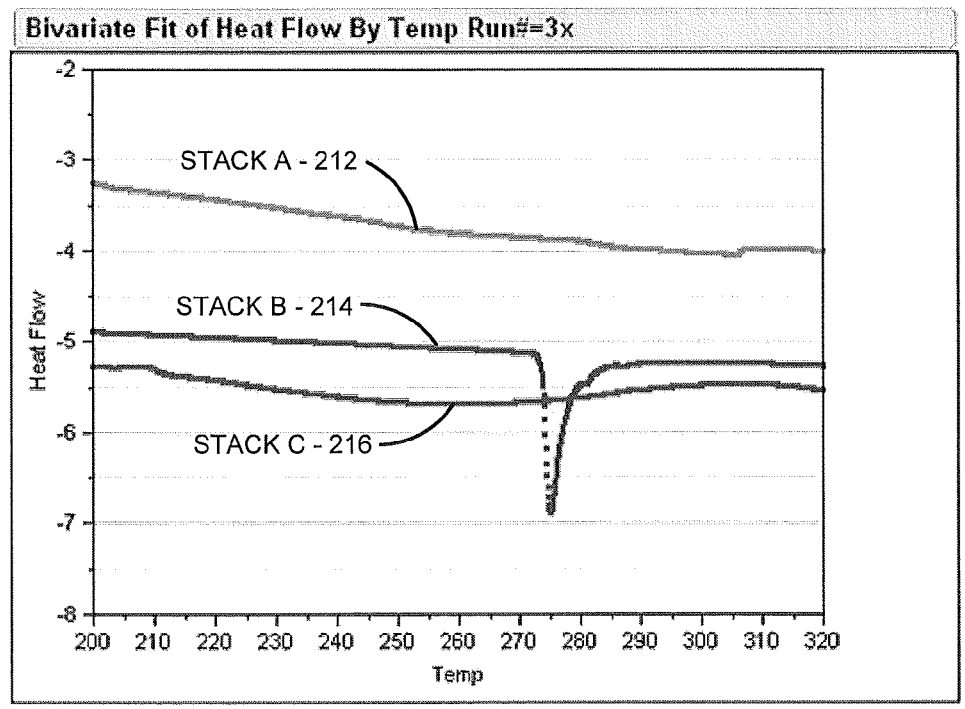

FIGS. 18A and 18B are graphs of differential scanning calorimetry (DSC) results for several different metal stacks. As is known in the art, differential scanning calorimetry is a thermoanalytical technique in which the difference in the amount of heat required to increase the temperature of a test sample and a reference sample is measured as a function of temperature. DSC analysis can be used to identify phase changes of a test sample.

FIG. 18A illustrates DSC results for a first DSC test of three different metal stacks, and FIG. 18B illustrates DSC results for three repeated DSC tests of the three different metal stacks that have already been re-flowed and melted. Referring to FIG. 18A, graph 202 is a graph of DSC results for a first metal stack (Stack A) consisting of 50 nm of titanium, 150 nm of platinum, 300 nm of nickel, 100 nm of gold, 2 microns of tin, and 30 nm of gold. Graph 204 is a graph of DSC results for a second metal stack (Stack B) consisting of 15 nm of titanium, 200 nm of nickel, and 3 microns of 80/20 gold/tin. Graph 206 is a graph of DSC results for a third metal stack (Stack C) consisting of 50 nm of titanium, 150 nm of platinum, 600 nm of nickel, 3 microns of tin, and 30 nm of gold.

As illustrated in FIG. 18A, Stack C had the lowest melting point at less than 230 degrees centigrade. Stack A had a melting point of about 260 degrees centigrade, while Stack B had a melting point of about 285 degrees centigrade.

Referring to FIG. 18B, the repeated DSC tests showed that Stack A and Stack C were thermally stable at temperatures up to 320 degrees centigrade, while Stack B melted at about 275 degrees centigrade.

Accordingly, a metal stack including a bonding layer as described above may be well suited for lead-free manufacturing processes, which typically require relatively high temperatures. In particular, a metal stack including a bonding layer as described above may be well suited for multiple lead-free reflow profiles that may be encountered during subsequent processing steps.

Moreover, a metal stack including a bonding layer as described above may be highly durable, and may not significantly corrode even when subjected to extreme environments, such as high temperature, high humidity environments for extended time periods. Thus, such metal stacks may be well suited for long-lifetime applications in various different types of devices and/or packages.

Metal stacks as described herein may be particularly suitable for mounting LED devices to package submounts, as they provide mechanical and/or electrical attachments with high thermal stability and/or high thermal strength with high electrical conductivity and/or low thermal resistance. FIGS. 19A, 19B, 20 and 21 are cross-sectional views semiconductor LED die mounted in various packages using metal die attach stacks in accordance with some embodiments.

Figure 19A:
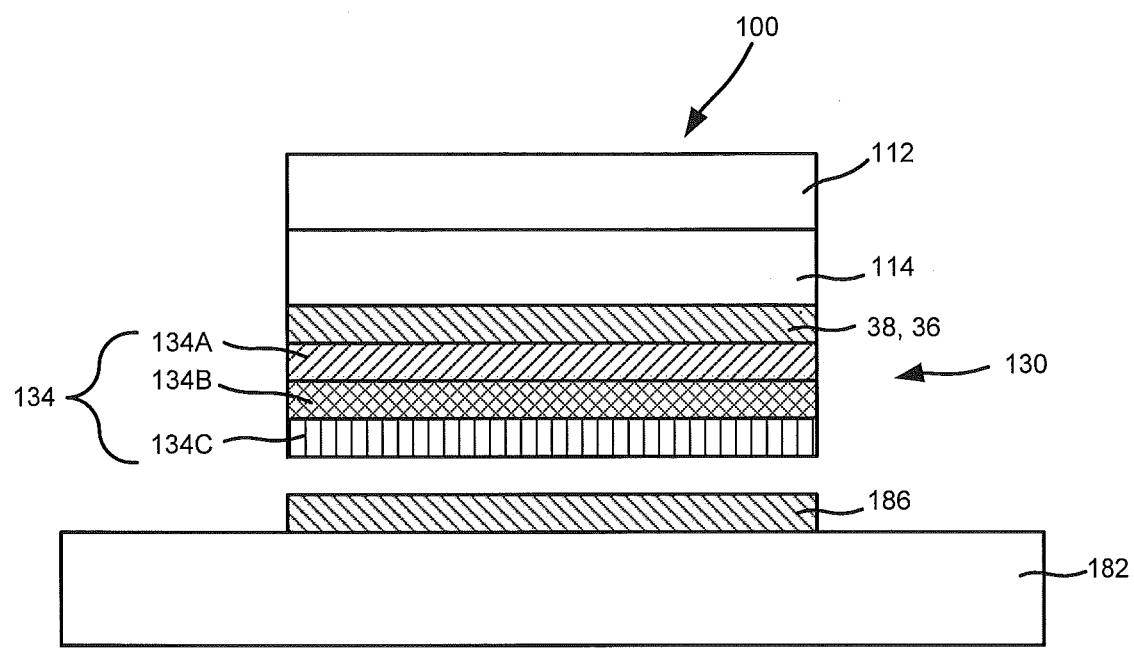
FIGS. 19A, 19B, 20 and 21 are cross-sectional views semiconductor LED die mounted in various packages using metal die attach stacks in accordance with some embodiments.

For example, FIG. 19A shows an LED die 100 including a die attach metal stack 130 as disclosed above that is flip-chip mounted onto a submount including a submount body 182 and a die attach pad 186. The LED die 100 includes a p-type region 114 and an n-type region 112. The LED die may include a growth substrate on which the epitaxial layers comprising the LED are grown, a carrier substrate onto which the epitaxial layers are transferred, or no substrate. The metal stack 130 includes adhesion and barrier layers 38, 36 and a eutectic bonding layer 134 on the adhesion and barrier layers. The bonding layer 134 includes a layer of nickel 134A, a layer of tin 134B on the nickel layer 134A, and a layer of gold 134C on the tin layer 134B.

Figure 19B:
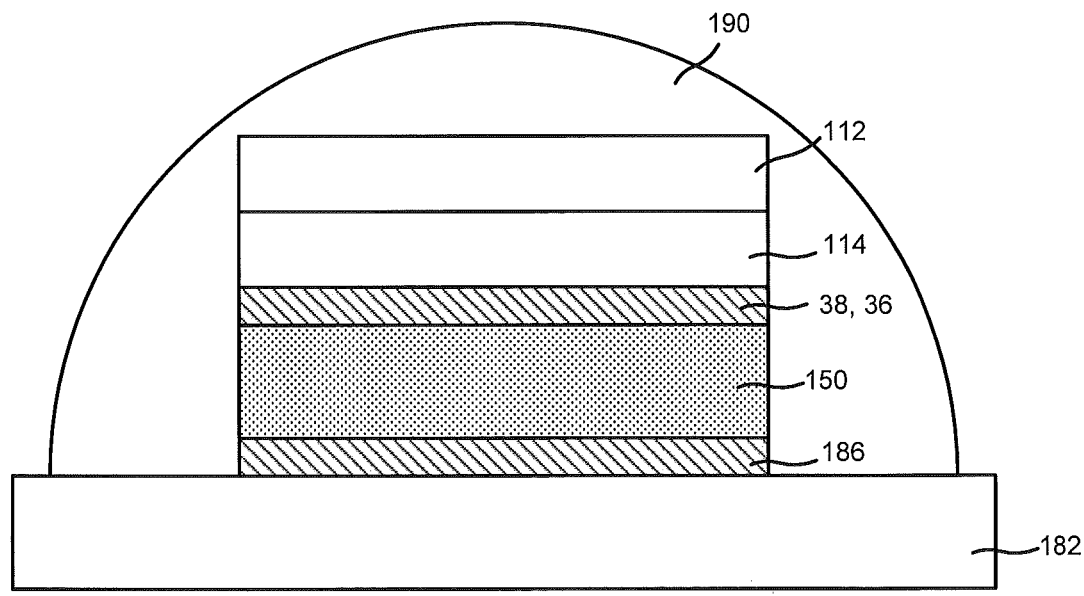
Figure 20:
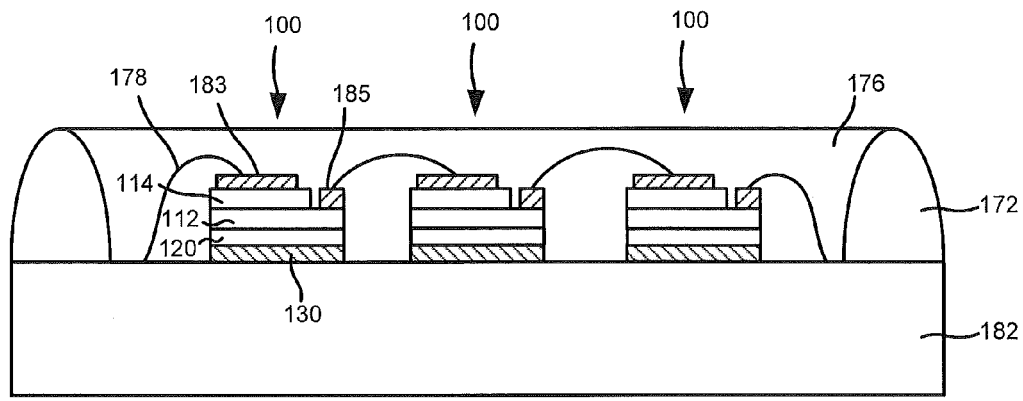

Referring to FIG. 19B, the die attach metal stack 130 of the LED die 100 is brought into contact with the die attach pad 186, and sufficient heat and/or force is applied to the die to cause the bonding layer to reflow, forming an alloyed bond layer 150 that holds the die 100 in place on the submount body 182. An encapsulant, such as silicone, is then dispensed to form a dome lens on the submount body 182 over the attached die 100.

Many different variations are possible within the scope of the present invention. For example, referring to FIG. 20, LED chips 100 may be mounted using a die attach metal stack 130 with the n-side down and wirebond connections 178 made to anode and cathode contacts 183, 185 formed on the p-type 114 and n-type 112 layers of the LED die 100, respectively. In the package shown in FIG. 19, multiple LED die 100 are mounted on a submount body 182 and wirebonded. An encapsulant dam 172 is formed on the submount body, and a liquid encapsulant is dispensed onto the submount body within the encapsulant dam to cover the attached LED die.

Figure 21:
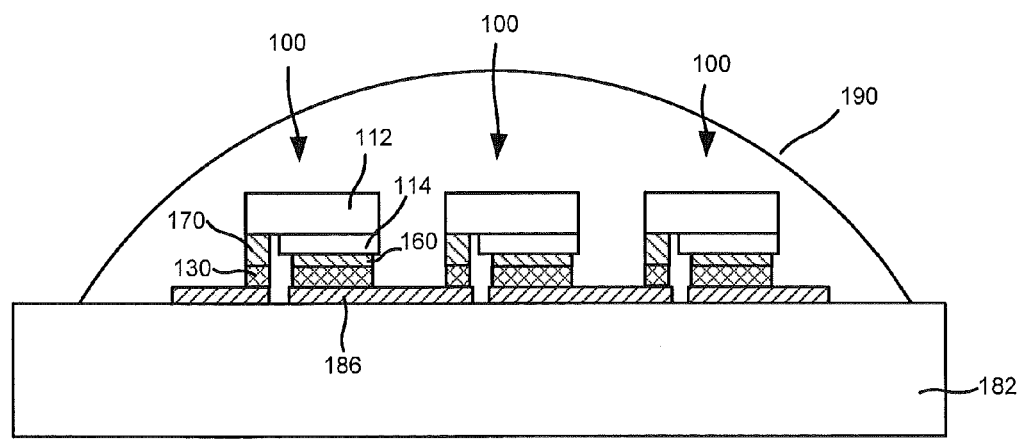

FIG. 21 illustrates embodiments in which multiple LED die 100 are flip-chip mounted onto a submount body 182 using die attach metal stacks 130 formed on the cathode and anode contacts 170, 160 on the n-type and p-type layers 114, 112 of the LED die that bond to respective die attach pads 186 on the submount body 182. An encapsulant dome 190 is then formed on the submount body 182 over the attached LED die.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A packaged light emitting diode, comprising:
   a package surface;
   a semiconductor light emitting diode mounted on the package surface; and
   a metal stack on the light emitting diode, the metal stack comprising a bonding layer on the light emitting diode that contacts the package surface and provides mechanical attachment of the light emitting diode to the package surface;
   wherein the bonding layer includes gold, tin and nickel, and wherein a weight percentage of tin in the bonding layer is greater than 40 percent, a weight percentage of nickel in the bonding layer is greater than 10 percent, and a weight percentage of gold in the bonding layer is less than 10 percent.

2. The packaged light emitting diode of claim 1, wherein a thickness of the bonding layer is at least 2.5 microns.

3. The packaged light emitting diode of claim 2, wherein the entire metal stack is less than 6 microns thick.

4. The packaged light emitting diode of claim 1, wherein the weight percentage of tin in the bonding layer is between 75 and 80 percent.

5. The packaged light emitting diode of claim 1, wherein the weight percentage of nickel in the bonding layer is greater than 15 percent.

6. The packaged light emitting diode of Claim 1, wherein the weight percentage of nickel in the bonding layer is greater than 20 percent.

7. The packaged light emitting diode of Claim 1, wherein the weight percentage of tin in the bonding layer is less than 80 percent.

8. The packaged light emitting diode of claim 1, wherein the weight percentage of gold the bonding layer is less than 5 percent.

9. The packaged light emitting diode of claim 1, wherein the weight percentage of gold the bonding layer is less than 2 percent.

10. The packaged light emitting diode of claim 1, wherein the metal stack further comprises a barrier layer, and wherein the entire metal stack contains gold in an amount of less than 5 percent by weight.

11. The packaged light emitting diode of claim 1, wherein the bonding layer comprises a metal alloy that is more than 90 percent nickel and tin by weight.

12. The packaged light emitting diode of claim 1, wherein the bonding layer comprises a metal alloy that is more than 95 percent nickel and tin by weight.

13. The packaged light emitting diode of claim 1, wherein the bonding layer comprises a metal alloy that is more than 97 percent nickel and tin by weight.

14. The packaged light emitting diode of claim 1, wherein the bonding layer comprises an alloy that is thermally stable at temperatures up to 260 degrees centigrade.

15. The packaged light emitting diode of claim 1, wherein the bonding layer comprises an alloy that is thermally stable at temperatures up to 290 degrees centigrade.

16. The packaged light emitting diode of claim 1, wherein the bonding layer comprises an alloy that is thermally stable at temperatures up to 310 degrees centigrade.

17. The packaged light emitting diode of claim 1, wherein the light emitting diode further comprising a substrate and a diode region on the substrate, wherein the metal stack is on the diode region opposite the substrate and bonds the diode region to the package surface.

18. The packaged light emitting diode of claim 1, wherein the light emitting diode further comprising a substrate and a diode region on the substrate, wherein the metal stack is on the substrate opposite the diode region and bonds the substrate to the package surface.

19. A light emitting diode structure comprising:
a light emitting active portion formed of epitaxial layers;
a carrier substrate for supporting the active portion;
a bonding layer that predominates in nickel and tin joining the active portion to the carrier substrate; and
a barrier layer between the bonding layer and the epitaxial layers, the barrier layer being formed of a material and having a thickness sufficient to reduce the formation or migration of free metals or alloys that have melting points lower than 300 degrees centigrade;
wherein the bonding layer includes gold, tin and nickel, and wherein a weight percentage of tin in the bonding layer is at least 70 percent, a weight percentage of gold in the bonding layer is less than 10 percent, and a weight percentage of nickel in the bonding layer is at least 10 percent.

20. A light emitting diode structure comprising:
a diode region; and
a metal stack on the diode region, the metal stack comprising a barrier layer on the diode region and a bonding layer on the barrier layer, wherein the barrier layer is between the bonding layer and the diode region;
wherein the bonding layer includes gold, tin and nickel, and wherein a weight percentage of tin in the bonding layer is between 70 percent and 80 percent, a weight percentage of gold in the bonding layer is less than 5 percent, and a weight percentage of nickel in the bonding layer is at least 15 percent.

21. A light emitting diode structure comprising:
a diode region; and
a metal stack on the diode region, the metal stack comprising a barrier layer on the diode region and a bonding layer on the barrier layer, wherein the barrier layer is between the bonding layer and the diode region;
wherein the bonding layer includes gold, tin and nickel, and wherein a weight percentage of tin in the bonding layer is at least 70 percent, a weight percentage of gold in the bonding layer is less than 10 percent, and a weight percentage of nickel in the bonding layer is at least 10 percent.

22. A light emitting diode structure comprising;
a diode region; and
a metal stack on the diode region, the metal stack comprising a bonding layer including a layer of nickel and a layer of tin,
wherein an initial melt temperature of the bonding layer is less than 230 degrees centigrade; and
wherein the layer of tin has a thickness of at least 2000 nm.

23. The light emitting diode structure of claim 22, wherein the bonding layer further comprises a layer of gold.

24. The light emitting diode structure of claim 22, wherein the metal stack further comprises a barrier layer and an adhesion layer that comprise metals other than gold, tin and nickel.

25. The light emitting diode of claim 24, wherein the adhesion layer comprises titanium and the barrier layer comprises platinum, and wherein the bonding layer further comprises gold.

26. The light emitting diode of claim 25, wherein the titanium adhesion layer is on the diode region, the platinum barrier layer is on the titanium adhesion layer, and the layer of nickel is on the platinum barrier layer.

27. The light emitting diode of claim 22,
wherein metals in the bonding layer form an alloy that is thermally stable at temperatures up to 260 degrees centigrade.

28. The light emitting diode of claim 22, wherein metals in the bonding layer form an alloy that is thermally stable at temperatures up to 290 degrees centigrade.

29. The light emitting diode of claim 22, wherein metals in the bonding layer form an alloy that is thermally stable at temperatures up to 310 degrees centigrade.

30. The packaged light emitting diode of claim 1, wherein the weight percentage of tin in the bonding layer is greater than 60 percent.

31. The light emitting diode structure of claim 19, wherein a thickness of the bonding layer is at least 2500 nm.

32. The light emitting diode structure of claim 20, wherein a thickness of the bonding layer is at least 2500 nm.

33. The light emitting diode structure of claim 21, wherein a thickness of the bonding layer is greater than 2.5 microns.

34. The light emitting diode structure of claim 22 wherein the layer of nickel and the layer of tin are configured to form a nickel-tin alloy at the initial melt temperature.

* * * * *

UNITED STATES PATENT AND TRADEMARK OFFICE
CERTIFICATE OF CORRECTION

PATENT NO. : 9,443,903 B2  Page 1 of 1
APPLICATION NO. : 13/361569
DATED : September 13, 2016
INVENTOR(S) : Bergmann et al.

It is certified that error appears in the above-identified patent and that said Letters Patent is hereby corrected as shown below:

In the Specification

Column 7, Line 43: Please correct "AkGaN," to read -- AlGaN, --

Signed and Sealed this
Eleventh Day of April, 2017

Michelle K. Lee
*Director of the United States Patent and Trademark Office*